(12) United States Patent
Narahashi et al.

(10) Patent No.: US 8,584,352 B2
(45) Date of Patent: Nov. 19, 2013

(54) PROCESS FOR PRODUCING MULTILAYER PRINTED WIRING BOARD

(75) Inventors: Hirohisa Narahashi, Kanagawa (JP); Shigeo Nakamura, Kanagawa (JP); Tadahiko Yokota, Kanagawa (JP)

(73) Assignee: Ajinomoto Co., Inc., Tokyo (JP)

( * ) Notice: Subject to any disclaimer, the term of this patent is extended or adjusted under 35 U.S.C. 154(b) by 231 days.

(21) Appl. No.: 12/869,926

(22) Filed: Aug. 27, 2010

(65) Prior Publication Data

US 2011/0036625 A1 Feb. 17, 2011

Related U.S. Application Data

(63) Continuation of application No. PCT/JP2009/053636, filed on Feb. 27, 2009.

(30) Foreign Application Priority Data

Feb. 27, 2008 (JP) .................. 2008-046318

(51) Int. Cl.
*H05K 3/02* (2006.01)

(52) U.S. Cl.
USPC ............... 29/846; 29/825; 29/830; 29/852; 427/96.1

(58) Field of Classification Search
USPC ............... 29/825, 830, 846, 852; 427/96.1
See application file for complete search history.

(56) References Cited

U.S. PATENT DOCUMENTS

| | | | | |
|---|---|---|---|---|
| 4,915,983 A | * | 4/1990 | Lake et al. | 430/314 |
| 5,426,849 A | * | 6/1995 | Kimbara et al. | 29/830 |
| 7,017,265 B2 | * | 3/2006 | Tani et al. | 29/852 |
| 7,614,145 B2 | * | 11/2009 | Wakizaka et al. | 29/846 |
| 2003/0145458 A1 | * | 8/2003 | Tani et al. | 29/830 |
| 2004/0161612 A1 | * | 8/2004 | Takanezawa et al. | 428/414 |
| 2005/0255270 A1 | * | 11/2005 | Takanezawa et al. | 428/36.5 |
| 2010/0040874 A1 | | 2/2010 | Narahashi et al. | |
| 2010/0044078 A1 | | 2/2010 | Narahashi et al. | |

FOREIGN PATENT DOCUMENTS

| | | |
|---|---|---|
| JP | 09-296156 | 11/1997 |
| JP | 11-074642 | 3/1999 |
| JP | 11-074643 | 3/1999 |
| JP | 2000-036659 | 2/2000 |
| JP | 2000-36661 | 2/2000 |
| JP | 2000-319386 | 11/2000 |
| JP | 2001-277424 | 10/2001 |
| JP | 2002-012667 | 1/2002 |
| JP | 2002-324969 | 11/2002 |
| JP | 2004-230729 | 8/2004 |
| JP | 2004-237447 | 8/2004 |
| JP | 2004-277460 | 10/2004 |
| JP | 2004-327931 | 11/2004 |
| JP | 2005-005560 | 1/2005 |
| JP | 2006-037083 | 2/2006 |
| JP | 2007-273616 | 10/2007 |
| JP | 2008-007575 | 1/2008 |
| TW | 384515 | 3/2000 |
| TW | 584596 (B) | 4/2004 |

OTHER PUBLICATIONS

Notice of Reasons for Refusal issued Jan. 8, 2013 in JP 2010-500756 (with English translation).

* cited by examiner

*Primary Examiner* — Carl Arbes
(74) *Attorney, Agent, or Firm* — Oblon, Spivak, McClelland, Maier & Neustadt, L.L.P.

(57) ABSTRACT

Multilayer printed wiring boards superior in formation of an ultrafine wiring, which can form a conductive layer superior in peel strength on a flat insulating layer surface, can be prepared by a method including the following steps (A)-(E):

(A) a step of laminating a film with a metal film, wherein a metal film layer is formed on a support layer, on an internal-layer circuit substrate via a curable resin composition layer, or laminating an adhesive film with a metal film, wherein a curable resin composition layer is formed on a metal film layer of the film with a metal film, on an internal-layer circuit substrate;
(B) a step of curing a curable resin composition layer to form an insulating layer;
(C) a step of removing a support layer;
(D) a step of removing a metal film layer; and
(E) a step of forming a metal film layer on an insulating layer surface by electroless plating.

56 Claims, No Drawings

PROCESS FOR PRODUCING MULTILAYER PRINTED WIRING BOARD

CROSS REFERENCES TO RELATED APPLICATIONS

This application is a continuation of International Patent Application No. PCT/JP2009/053636, filed on Feb. 27, 2009, and claims priority to Japanese Patent Application No. 2008-046318, filed on Feb. 27, 2008, both of which are incorporated herein by reference in their entireties.

BACKGROUND OF THE INVENTION

1. Field of the Invention

The present invention relates to methods for producing a multilayer printed wiring board.

2. Discussion of the Background

Multilayer printed wiring boards widely used for various electronic instruments are required to have thin layer and ultrafine wiring circuit to achieve downsizing and high-functionalization of electronic instruments. As a technique for producing a multilayer printed wiring board, a production method using a build-up process of alternately layering an insulating layer and a conductive layer on a core substrate is known. For example, a curable resin composition is laminated on an internal-layer circuit substrate with an adhesive film, and the curable resin composition is cured to form an insulating layer. Thereafter, the insulating layer is roughened with an oxidizing agent such as alkaline potassium permanganate solution and the like, a plating seed layer is formed on the roughened surface by electroless plating according to a semi-additive process, and then a conductive layer is formed by electroplating. In conductive layer formation by a semi-additive process here, the surface of an insulating layer needs to be roughened with an oxidizing agent (concaves and convexes are formed on the surface) as mentioned above to provide an anchor effect between conductive layers, so that a conductive layer having high adhesion strength can be obtained. When a plating seed layer, which is unnecessary for circuit formation, is removed by etching, however, problems occur in that the seed layer in the anchor part is difficult to remove, and when the seed layer in the anchor part is etched under conditions permitting sufficient removal, the wiring pattern is remarkably dissolved, thus preventing ultrafine wiring.

To solve such problems, a method including transferring a metal film layer to be a plating seed layer onto an adherend by a film with a metal film has been tried. For example, JP-A-2004-230729 and JP-A-2002-324969 patent disclose a method of forming a conductive layer, which includes preparing a film with a metal film, wherein a metal film layer is formed on a support layer, via a release layer by vapor deposition and the like, transferring the metal film layer of the film with the metal film onto the surface of an insulating layer or prepreg, which is on the substrate, and forming a conductive layer on the transferred metal film layer by plating and the like. In the method of JP-A-2004-230729, a film with a metal film using fluorocarbon resin, polyolefin resin, polyvinyl alcohol resin as a release layer is used, and in the method of JP-A-2002-324969, a film with a metal film using an adhesive containing an adhesive resin such as acrylic resin, melamine resin and the like as a release layer is used. On the other hand, JP-A-9-296156 discloses an adhesive film obtained by directly forming a metal film layer on a support layer by vapor deposition and the like and forming a resin composition layer thereon.

SUMMARY OF THE INVENTION

A method of transferring a copper film to an adherend by the film with a metal film for transferring the metal film is considered to be advantageous for ultrafine wiring since a conductive layer can be formed on a smooth insulating layer surface. On the other hand, the method is problematic in the production of a multilayer printed wiring board, since a blind via (sometimes referred to as "via" in the present specification) forming step and a desmear step are present before formation of a conductive layer, and the transferred copper film easily suffers from a damage. For example, when a blind via is formed by laser etc., the copper film around the blind via easily suffers from a damage. When a desmear treatment is performed by a treatment with an oxidizing agent such as alkaline potassium permanganate solution and the like after the blind via formation, a neutralizing treatment with an acidic solution is necessary, thus causing problems of damage on the copper film by etching.

As a measure for solving the above-mentioned problems, the thickness of the copper film to be transferred may be increased. However, since the copper film to be the plating seed layer is thickened, removal thereof by etching for circuit formation takes a long time, which is disadvantageous for ultrafine wiring. In particular, when a blind via is formed for electric connection between layers, electroless plating is also necessary around the blind via and via wall surface, and therefore, an electroless plating layer is further formed on the copper film. Thus, when a plating seed layer (copper film layer+electroless plating layer) is removed by etching for circuit formation, the high layer thickness of the copper film causes a prominent problem of dissolution of wiring pattern due to the extended etching time.

Accordingly, it is one object of the present invention to provide novel methods for producing a multilayer printed wiring board.

It is another object of the present invention to provide novel printed wiring boards produced by such a method.

These and other objects, which will become apparent during the following detailed description, have been achieved by the inventors' discovery that when a transferred copper film is removed by etching and a copper film layer to be a plating seed layer is formed again by electroless plating, a conductive layer formed thereafter by electroplating surprisingly shows high peel strength. A thin and uniform plating seed layer can be formed on a smooth insulating layer surface by removing the transferred copper film by etching, forming a copper film on a via wall surface etc. by electroless plating while simultaneously forming a copper film again on an insulating layer surface by electroless plating. Therefore, when a circuit is formed thereafter by a semi-additive process and the like, the plating seed layer can be easily removed by etching, and dissolution of wiring pattern can be suppressed.

Accordingly, the present invention provides the following:

(1) A method of producing a multilayer printed wiring board, comprising the following steps (A)-(E):

(A) a step of laminating a film with a metal film, wherein a metal film layer is formed on a support layer, on an internal-layer circuit substrate via a curable resin composition layer, or laminating an adhesive film with a metal film, wherein a curable resin composition layer is formed on a metal film layer of the film with a metal film, on an internal-layer circuit substrate, (B) a step of curing a curable resin composition layer to form an insulating layer, (C) a step of removing a support layer, (D) a step of removing a metal film layer, and (E) a step of forming a metal film layer on an insulating layer surface by electroless plating.

(2) The method of the above-mentioned (1), wherein the metal film layer of the film with the metal film or the adhesive film with the metal film is formed by one or more kinds of methods selected from a vapor deposition method, a sputtering method and an ion plating method.

(3) The method of the above-mentioned (1) or (2), wherein the metal film layer of the film with the metal film or the adhesive film with the metal film is formed from copper.

(4) The method of any of the above-mentioned (1) to (3), wherein the metal film layer of (E) a step of forming a metal film layer on an insulating layer surface by electroless plating is formed from copper.

(5) The method of any of the above-mentioned (1) to (4), wherein the insulating layer surface after (D) a step of removing a metal film layer has an arithmetic mean roughness (Ra) of not more than 200 nm.

(6) The method of any of the above-mentioned (1) to (4), wherein the insulating layer surface after (D) a step of removing a metal film layer has an arithmetic mean roughness (Ra) of not more than 90 nm.

(7) The method of any of the above-mentioned (1) to (6), further comprising:

(F) a step of forming a blind via after (B) a step of curing a curable resin composition layer to form an insulating layer, or (C) a step of removing a support layer.

(8) The method of the above-mentioned (7), further comprising:

(G) a desmear step after (F) a step of forming a blind via.

(9) The method of any of the above-mentioned (1) to (8), further comprising:

(H) a step of forming a conductive layer by electroplating after (E) a step of forming a metal film layer on an insulating layer surface by electroless plating.

(10) The method of any of the above-mentioned (1) to (9), wherein a release layer is present between the support layer and the metal film layer of the film with the metal film or adhesive film with the metal film.

(11) The method of the above-mentioned (10), wherein the release layer is formed from one or more kinds of water-soluble polymers selected from a water-soluble cellulose resin, a water-soluble polyester resin and a water-soluble acrylic resin.

(12) The method of the above-mentioned (11), wherein the water-soluble polyester resin is a water-soluble polyester having a sulfo group or a salt thereof and/or a carboxyl group or a salt thereof, and the water-soluble acrylic resin is a water-soluble acrylic resin having a carboxyl group or a salt thereof.

(13) The method of any of the above-mentioned (10) to (12), further comprising:

(I) a step of removing a release layer after (C) a step of removing a support layer.

(14) The method of any of the above-mentioned (10) to (13), wherein the release layer has a layer thickness of 0.01 µm to 20 µm.

(15) The method of any of the above-mentioned (1) to (14), wherein the metal film layer of the film with the metal film or adhesive film with the metal film has a layer thickness of 25 nm to 5000 nm.

(16) The method of any of the above-mentioned (1) to (15), wherein the support layer has a layer thickness of 10 µm to 70 µm.

(17) The method of any of the above-mentioned (1) to (16), wherein the support layer has an arithmetic mean roughness (Ra) of not more than 50 nm.

(18) The method of any of the above-mentioned (1) to (17), wherein the support layer is a plastic film.

(19) The method of any of the above-mentioned (1) to (17), wherein the support layer is a poly(ethylene terephthalate) film.

(20) The method of any of the above-mentioned (1) to (19), wherein the curable resin composition comprises a component having a hetero atom in a molecule.

(21) The method of any of the above-mentioned (1) to (19), wherein the curable resin composition comprises a component having a nitrogen atom in a molecule.

(22) The method of any of the above-mentioned (1) to (19), wherein the curable resin composition comprises an epoxy resin and a curing agent.

(23) The method of the above-mentioned (22), wherein the curing agent comprises a nitrogen atom in a molecule.

(24) The method of the above-mentioned (22), wherein the curing agent is a triazine skeleton-containing phenol novolac resin and/or a triazine skeleton-containing cresol novolac resin.

(25) The method of any of the above-mentioned (20) to (24), wherein the curable resin composition further comprises a thermoplastic resin.

(26) The method of any of the above-mentioned (20) to (25), wherein the curable resin composition further comprises an inorganic filler.

(27) The method of any of the above-mentioned (1) to (26), wherein the curable resin composition layer is a prepreg comprised of a sheet-like reinforcing substrate made of fiber and impregnated with the curable resin composition.

(28) A multilayer printed wiring board comprising an insulating layer and a conductive layer, wherein the conductive layer is formed on an insulating layer surface having an arithmetic mean roughness (Ra) of not more than 200 nm, and a nitrogen atom concentration as measured by an X-ray photoelectron spectrometer of the insulating layer surface on which the conductive layer is formed is higher than that of the insulating layer lower part.

According to the production method of a multilayer printed wiring board of the present invention, a conductive layer superior in the peel strength can be formed on a flat insulating layer surface by electroless plating, or by electroless plating and electroplating. In addition, since a conductive layer can be formed on a flat surface, a plating seed layer can be removed by etching under mild conditions. As a result, dissolution of wiring pattern can be suppressed and a method superior in the formation of an ultrafine wiring can be afforded.

DETAILED DESCRIPTION OF THE PREFERRED EMBODIMENTS

The present invention is explained in detail in the following by referring to preferable embodiments thereof.

In the production method of a multilayer printed wiring board of the present invention, a film with a metal film, wherein a metal film layer is formed on a support layer, (film for transferring metal film), or an adhesive film with a metal film wherein a metal film layer is formed on a support layer and a curable resin composition layer is formed on the metal film layer is used.

Support Layer.

The support layer is film or sheet having a self-standing property, and a metal foil, a plastic film and the like can be used, and a plastic film is particularly preferably used. As the metal foil, aluminum foil, copper foil and the like can be mentioned. When a metal foil is used as the support layer and the film with a metal film does not have a release layer, a metal foil made of a metal other the metal film layer to be formed is employed. As the plastic film, poly(ethylene terephthalate) film, poly(ethylene naphthalate), polyimide, polyamide-imide, polyamide, polytetrafluoroethylene, polycarbonate and the like can be mentioned. Preferred are a poly(ethylene terephthalate) film and poly(ethylene naphthalate) film, and particularly preferred is economical poly(ethylene terephthalate). The support layer surface may be subjected to a surface treatment such as a corona treatment and the like. The support layer film surface on the side free of a metal film layer and a release layer may also be subjected to a surface treatment such as a mat treatment, a corona treatment and the like. The support layer surface on the side where a release layer is formed preferably has an arithmetic mean roughness (Ra) of not more than 50 nm (not less than 0 and not more than 50 nm), moreover, not more than 40 nm, further, not more than 35 nm, and further, not more than 30 nm, to prevent cracking during production of a film with a metal film. In addition, the arithmetic mean roughness of the support layer surface on the side where a release layer is not formed is also preferably the same as the above-mentioned range. The arithmetic mean roughness (Ra value) can be measured by a known method and can be measured using, for example, an apparatus such as a noncontact surface roughness meter (e.g., WYKO NT3300 manufactured by Veeco Instruments, etc.) and the like. A commercially available support may also be used and, for example, T60 (poly(ethylene terephthalate) film manufactured by Toray Industries, Inc.), A4100 (poly(ethylene terephthalate) film manufactured by Toyobo Co., Ltd.), Q83 (poly(ethylene naphthalate) film manufactured by Teijin DuPont Films Japan Limited), Diafoil OB100 (poly(ethylene terephthalate) film manufactured by Mitsubishi polyester film Co., Ltd.), a poly(ethylene terephthalate) film with an alkyd type release agent (AL-5, manufactured by LINTEC Corporation), which is a commercially available product manufactured by LINTEC Corporation, and the like can be mentioned.

The layer thickness of the support layer is generally 10 to 70 μm, preferably 15 to 70 μm. When the layer thickness is too small, problems occur such as inferior handling property, decreased release property of the support layer, inconvenience in the formation of a smooth metal film layer and the like. When the layer thickness is too large, it is disadvantageous in the cost and is not practical.

Release Layer.

The film with a metal film and adhesive film with a metal film in the present invention preferably has a release layer between the support layer and the metal film layer to efficiently transfer the metal film to the adherend surface.

A release layer can be formed by using a polymer release layer of a fluorocarbon resin, an alkyd resin, a silicone resin, a polyolefin resin, a polyvinyl alcohol resin, an acrylic resin, a polyester resin, a melamine resin, cellulose and the like.

As a release layer, a metal film formed by a vapor deposition method, a sputtering method, an ion plating method etc. or a metal foil can also be used. Examples of the metal include aluminum, zinc, lead, nickel and the like, with preference given to aluminum.

A release layer is preferably formed from one or more kinds of water-soluble polymers selected from a water-soluble cellulose resin, a water-soluble acrylic resin and a water-soluble polyester resin from the aspects of uniform transfer of a metal film and the cost of forming a release layer. These water-soluble polymer release layers permit easy formation of a release layer on a support layer as compared to a metal release layer, and are advantageous in view of cost. Furthermore, since a support layer can be released between support layer—release layer after curing of a curable resin composition, which is an adherend, a metal film layer is not damaged easily. In addition, since a release layer remaining on a metal film layer can be conveniently removed with an aqueous solution, a metal film can be uniformly formed on the adherend. Among these, a water-soluble cellulose resin and a water-soluble polyester resin are more preferable, and a water-soluble cellulose resin is particularly preferable. Generally, either water-soluble polymer is used singly as a water-soluble polymer release layer, or two or more kinds of water-soluble polymers can also be used in a mixture. Generally, moreover, a water-soluble polymer release layer formed is a single layer or optionally has a multilayer structure formed from two or more kinds of different water-soluble polymers to be used.

When a water-soluble polymer release layer is used as a release layer, another release layer of a silicone resin, an alkyd resin, a fluorocarbon resin and the like may be present between a water-soluble polymer release layer and a support layer to improve release property between these layers. That is, when a water-soluble polymer is applied to a release layer, at least the surface of the release layer to be adhered to the metal film only needs to be formed from a water-soluble polymer. For example, the release layer may be formed from a water-soluble polymer release layer alone, or a two-layer structure of a water-soluble polymer release layer and other release layer may be formed so that the surface adhered to the metal film can be formed from a water-soluble polymer. When these water-soluble resins are employed as a release layer on at least the surface adhered to the metal film, a support layer can be released between support layer—release layer after curing of a curable resin composition which is an adherend, and thereafter, since a release layer remaining on a metal film layer can be conveniently removed with an aqueous solution, a metal film superior in the uniformity can be formed on the adherend. The detachment of support between support layer—release layer occurs in the interface between support and release layer when the release layer is formed from the above-mentioned water-soluble resin alone, and occurs in the interface between the other release layer such as alkyd resin and the like and the above-mentioned water-soluble resin release layer when the release layer is formed from the two layers of such other release layer and the water-soluble resin release layer.

The layer thickness of the release layer is generally not less than 0.01 μm and not more than 20 μm (0.01 to 20 μm), more preferably not less than 0.05 μm and not more than 10 μm, more preferably not less than 0.1 μm and not more than 5 μm, more preferably not less than 0.1 μm and not more than 3 μm, more preferably not less than 0.1 μm and not more than 2 μm, more preferably not less than 0.1 μm and not more than 1 μm, more preferably not less than 0.2 μm and not more than 1 μm. The "layer thickness" here means the thickness of the release layer when it is a single layer, and the total thickness of multi layers when it is a multilayer. For example, when the release layer consists of a water-soluble polymer release layer and another release layer such as a silicone resin, an alkyd resin, a fluorocarbon resin and the like as mentioned above, the total layer thickness of these release layers is set to fall within the above-mentioned range. In this case, the layer thickness of the release layer other than the water-soluble resin release layer is preferably within the range of 0.01 to 0.2 μm. When the layer thickness of the release layer is too large, inconveniences such as cracks and scars in a metal film layer due to the difference in the coefficient of thermal expansion between a metal film layer and a release layer and the like may occur during heat curing the curable resin composition layer. When the layer thickness is too thin, the release property of the support layer may decrease.

Water-Soluble Cellulose Resin.

The "water-soluble cellulose resin" in the present invention is a cellulose derivative subjected to a treatment to impart water-solubility to cellulose. Preferably, cellulose ether, cellulose ether ester and the like can be mentioned.

Cellulose ether is an ether formed by conversion of one or more hydroxyl groups present in one or more anhydroglucose repeat units of cellulose polymer such that one or more ether linkage groups are formed in a cellulose polymer. Examples of the ether linkage group generally include an alkyl group (carbon number 1-4) optionally substituted by one or more kinds of substituents selected from a hydroxyl group, a carboxyl group, an alkoxy group (carbon number 1-4) and a hydroxy-alkoxy group (carbon number 1-4). Specifically, a hydroxyalkyl group (carbon number 1-4) such as 2-hydroxyethyl, 2-hydroxypropyl, 3-hydroxypropyl and the like; an alkoxy (carbon number 1-4) alkyl group (carbon number 1-4) such as 2-methoxyethyl, 3-methoxypropyl, 2-methoxypropyl, 2-ethoxyethyl and the like; a hydroxy-alkoxy (carbon number 1-4) alkyl group (carbon number 1-4) such as 2-(2-hydroxyethoxy)ethyl, 2-(2-hydroxypropoxy)propyl and the like, a carboxyalkyl group (carbon number 1-4) such as carboxymethyl and the like, and the like can be mentioned. The ether linkage group in a polymer molecule may be a single kind or plural kinds. That is, it may be a cellulose ether having a single kind of ether linkage group, or cellulose ether having plural kinds of ether linkage groups.

Specific examples of cellulose ether include methylcellulose, hydroxyethylcellulose, hydroxypropylcellulose, hydroxypropylmethylcellulose, hydroxybutylmethylcellulose, hydroxyethylethylcellulose, carboxymethylcellulose and water-soluble salts thereof (e.g., alkali metal salt such as sodium salt and the like).

While the average number of moles of ether groups substituted per glucose ring unit in cellulose ether is not particularly limited, it is preferably 1 to 6. The molecular weight of cellulose ether is preferably about 20000 to 60000 in weight average molecular weight.

On the other hand, cellulose ether ester is an ester formed between one or more hydroxyl groups present in cellulose and one or more preferable organic acids or a reactive derivative thereof, whereby an ester linkage group is formed in cellulose ether. The "cellulose ether" here is as mentioned above, "organic acid" includes aliphatic or aromatic carboxylic acid (preferably carbon number 2-8), and aliphatic carboxylic acid may be acyclic (branched or non-branched) or cyclic and saturated or unsaturated. Specific examples of the aliphatic carboxylic acid include substituted or unsubstituted acyclic aliphatic dicarboxylic acid such as acetic acid, propionic acid, butyric acid, valeric acid, malonic acid, succinic acid, glutaric acid, fumaric acid, maleic acid and the like; acyclic hydroxy-substituted carboxylic acid such as glycolic acid or lactic acid and the like; acyclic aliphatic hydroxy-substituted di- or tri-carboxylic acid such as malic acid, tartaric acid, citric acid and the like, and the like. As aromatic carboxylic acid, an aryl carboxylic acid having a carbon number of 14 or below is preferable, and an aryl carboxylic acid containing an aryl group such as phenyl or naphthyl group having one or more carboxyl groups (e.g., 1, 2 or 3 carboxyl groups) is particularly preferable. The aryl group is optionally substituted by one or more (e.g., 1, 2 or 3) the same or different groups selected from hydroxy, alkoxy having a carbon number of 1-4 (e.g., methoxy) and sulfonyl. Preferable examples of an aryl carboxylic acid include phthalic acid, isophthalic acid, terephthalic acid, trimellitic acid (1,2,4-benzenetricarboxylic acid) and the like.

When the organic acid has one or more carboxyl groups, only one carboxyl group of acid preferably forms an ester linkage with cellulose ether. For example, in the case of hydroxypropylmethylcellulose succinate, one carboxyl group of each succinate group forms an ester linkage with cellulose, and other carboxy group is present as a free acid. The "ester linkage group" is formed by a reaction of cellulose or cellulose ether with the above-mentioned preferable organic acid or a reactive derivative thereof. Preferable reactive derivatives include, for example, acid anhydride such as phthalic anhydride and the like.

The ester linkage group in a polymer molecule may be of a single kind or plural kinds. That is, it may be cellulose ether ester having a single kind of ester linkage group or plural kinds of ester linkage groups. For example, hydroxypropylmethylcellulose acetate succinate is a mixed ester of hydroxypropylmethylcellulose having both a succinate group and an acetate group.

Preferable examples of the cellulose ether ester include esters of hydroxypropylmethylcellulose or hydroxypropylcellulose, specifically, hydroxypropylmethylcellulose acetate, hydroxypropylmethylcellulose succinate, hydroxypropylmethylcellulose acetate succinate, hydroxypropylmethylcellulose phthalate, hydroxypropylmethylcellulose trimellitate, hydroxypropylmethylcellulose acetate phthalate, hydroxypropylmethylcellulose acetate trimellitate, hydroxypropylcellulose acetate phthalate, hydroxypropylcellulose butyrate phthalate, hydroxypropylcellulose acetate phthalate succinate and hydroxypropylcellulose acetate trimellitate succinate and the like. One or more kinds of these can be used.

Among these, hydroxypropylmethylcellulose phthalate, hydroxypropylmethylcellulose acetate succinate and hydroxypropylmethylcellulose acetate phthalate are preferable.

While the average number of moles of ester groups substituted per glucose ring unit in cellulose ether ester is not particularly limited, for example, it is preferably about 0.5% to 2%. The molecular weight of cellulose ether ester is preferably about 20000 to 60000 in weight average molecular weight.

The production methods of cellulose ether and cellulose ether ester are known, and they can be obtained by reacting cellulose (pulp) derived from a natural product as a starting material with an etherifying agent or an esterifying agent according to a conventional method. In the present invention, a commercially available product may be used. For example, "HP-55", "HP-50" manufactured by Shin-Etsu Chemical Co., Ltd. (both hydroxypropylmethylcellulose phthalate), "60SH-06" (hydroxypropylmethylcellulose) and the like can be mentioned.

Water-Soluble Polyester Resin.

The "water-soluble polyester resin" in the present invention is a polyester resin of a substantially linear polymer having a hydrophilic group introduced into a molecule or molecule terminal, which is synthesized by a conventional polycondensation reaction using s polyvalent carboxylic acid or an ester-formable derivative thereof with polyvalent alcohol or an ester-formable derivative thereof as major starting materials. Here, as the hydrophilic group, organic acid groups such as a sulfo group, carboxyl group, phosphoric acid group and the like or a salt thereof, and the like can be mentioned, with preference given to a sulfonic acid group or a salt thereof, carboxylic acid group or a salt thereof. As the water-soluble polyester resin, one having a sulfo group or a salt thereof and/or a carboxyl group or a salt thereof is particularly preferable.

Representative examples of the polyvalent carboxylic acid component of the polyester resin include terephthalic acid, isophthalic acid, phthalic acid, phthalic anhydride, 2,6-naphthalene dicarboxylic acid, 1,4-cyclohexane dicarboxylic acid, adipic acid and the like, which may be used singly or in combination of two or more kinds thereof. In addition, together with the above-mentioned various compounds, a small amount of hydroxycarboxylic acid such as p-hydroxybenzoic acid and the like, unsaturated carboxylic acid such as maleic acid, fumaric acid or itaconic acid and the like may be used in combination.

Representative examples of the polyvalent alcohol component of the polyester resin include ethylene glycol, 1,4-butanediol, neopentyl glycol, diethylene glycol, dipropylene glycol, 1,6-hexaneglycol, 1,4-cyclohexanemethanol, xylylene glycol, dimethylolpropionic acid, glycerol, trimethylolpropane, poly(tetramethyleneoxide) glycol and the like, which may be used singly or in combination of two or more kinds thereof.

A hydrophilic group can be introduced into a molecule or molecule terminal of the polyester resin by a conventionally-known method. Preferred is an embodiment wherein a hydrophilic group-containing ester-formable compound (e.g., aromatic carboxylic acid compound, hydroxy compound etc.) is copolymerized.

For example, when a sulfonate group is introduced, one or more kinds selected from 5-sodium sulfonate-isophthalic acid, 5-ammonium sulfonate-isophthalic acid, 4-sodium sulfonate-isophthalic acid, 4-ammonium methylsulfonate-isophthalic acid, 2-sodium sulfonate-terephthalic acid, 5-potassium sulfonate-isophthalic acid, 4-potassium sulfonate-isophthalic acid and 2-potassium sulfonate-terephthalic acid and the like are preferably copolymerized.

When a carboxylic acid group is introduced, for example, one or more kinds selected from trimellitic anhydride, trimellitic acid, pyromellitic anhydride, pyromellitic acid, trimesic acid, cyclobutane tetracarboxylic acid, dimethylolpropionic acid and the like are preferably copolymerized. After the copolymerization reaction, the carboxylate group can be introduced into a molecule by neutralization with an amino compound, ammonia or an alkali metal salt and the like.

While the molecular weight of the water-soluble polyester resin is not particularly limited, the weight average molecular weight is preferably about 10000 to 40000. When it is less than 10000, layer formability tends to decrease, and when it exceeds 40000, the solubility tends to decrease.

In the present invention, as a water-soluble polyester resin, a commercially available product can be used and, for example, "PLAS COAT Z-561" (weight average molecular weight: about 27000) and "PLAS COAT Z-565" (weight average molecular weight: about 25000) both manufactured by GOO CHEMICAL Co., Ltd., and the like can be mentioned.

Water-Soluble Acrylic Resin.

The "water-soluble acrylic resin" in the present invention is an acrylic resin which disperses or dissolves in water since it contains a carboxyl group-containing monomer as an essential component.

The acrylic resin more preferably contains a carboxyl group-containing monomer and (meth)acrylate as essential monomer components and, where necessary, is an acrylic polymer containing other unsaturated monomer as a monomer component.

In the above-mentioned monomer component, examples of the carboxyl group-containing monomer include (meth) acrylic acid, maleic acid, fumaric acid, crotonic acid, itaconic acid, citraconic acid, maleic anhydride, monomethyl maleate, monobutyl maleate, monomethyl itaconate, monobutyl itaconate and the like, and one or more kinds of these can be used. Among these, (meth)acrylic acid is preferable.

Examples of the (meth)acrylate include alkyl (meth)acrylate wherein alkyl has a carbon number of 1-18, such as methyl (meth)acrylate, ethyl (meth)acrylate, n-propyl (meth)acrylate, n-butyl (meth)acrylate, isobutyl (meth)acrylate, n-pentyl (meth)acrylate, n-hexyl (meth)acrylate, n-heptyl (meth)acrylate, n-octyl (meth)acrylate, 2-ethylhexyl (meth)acrylate, nonyl (meth)acrylate, decyl (meth)acrylate, dodecyl (meth)acrylate, stearyl (meth)acrylate and the like, and one or more kinds of these can be used.

Examples of other unsaturated monomers include an aromatic alkenyl compound, a vinyl cyanide compound, a conjugated diene compound, a halogen-containing unsaturated compound, a hydroxyl group-containing monomer and the like. Examples of the aromatic alkenyl compound include styrene, α-methylstyrene, p-methylstyrene, p-methoxystyrene and the like. Examples of the vinyl cyanide compound include acrylonitrile, methacrylonitrile and the like. Examples of the conjugated diene compound include butadiene, isoprene and the like. Examples of the halogen-containing unsaturated compound include vinyl chloride, vinylidene chloride, p-fluoroethylene, perfluoropropylene, vinylidene fluoride and the like. Examples of the hydroxyl group-containing monomer include 2-hydroxyethyl (meth)acrylate, 2-hydroxypropyl (meth)acrylate, 3-hydroxypropyl (meth) acrylate, 2-hydroxybutyl (meth)acrylate, 4-hydroxybutyl acrylate, 4-hydroxybutyl methacrylate, α-hydroxymethylethyl (meth)acrylate and the like, and one or more kinds of these can be used.

As mentioned below, in the present invention, the release layer is preferably formed by a method comprising applying a coating solution containing water-soluble cellulose, water-soluble polyester or water-soluble acrylic resin to a support layer and drying same. When a water-soluble acrylic resin is used, the coating solution can be used in an emulsion form or an aqueous solution form.

When the water-soluble acrylic resin is used in an emulsion form, a core shell type emulsion is preferable. In a core shell type emulsion, the presence of a carboxyl group in the shell of core shell particles is important. Therefore, the shell is constituted by an acrylic resin containing a carboxyl group-containing monomer and (meth)acrylate.

As such dispersion product of core shell particles (emulsion), a commercially available product can be used. For example, JONCRYL 7600 (Tg: about 35° C.), 7630A (Tg: about 53° C.), 538J (Tg: about 66° C.), 352D (Tg: about 56° C.) (all manufactured by BASF Japan Ltd.) and the like can be mentioned.

When a water-soluble acrylic resin is used in the form of an aqueous solution, it is important that the acrylic resin should contain a carboxyl group-containing monomer and (meth) acrylate, and have a comparatively low molecular weight. Therefore, the weight average molecular weight is preferably 1000 to 50000. When the weight average molecular weight is less than 1000, the layer formability tends to decrease, and when the weight average molecular weight exceeds 50000, adhesion to the support layer becomes high, and the release property of the support layer after curing tends to decrease.

As such an aqueous solution of a water-soluble acrylic resin, a commercially available product can be used and, for example, JONCRYL 354J (manufactured by BASF Japan Ltd.) and the like can be mentioned.

Of an emulsion and an aqueous solution of a water-soluble acrylic resin, the emulsion can be easily processed into a thin film since it has a higher molecular weight. Therefore, an emulsion of a water-soluble acrylic resin is preferable.

Metal Film Layer.

As a metal to be used for a metal film layer, an elemental metal such as gold, platinum, silver, copper, aluminum, cobalt, chrome, nickel, titanium, tungsten, iron, tin, indium and the like, and a solid solution (alloy) of two or more kinds of metals such as nickel-chrome alloy and the like can be used. From the aspects of broad utility of metal film formation, cost, easiness of removal by etching and the like, copper is particularly preferable. Although not generally necessity, the metal film layer may be a single layer or multilayer structure wherein two or more different metal layers are laminated.

The metal film layer is preferably formed by one or more kinds of methods selected from a vapor deposition method, a sputtering method and an ion plating method. When a metal foil such as copper foil and the like is used instead of a metal film layer, a conductive layer superior in peel strength is difficult to form on a smooth insulating layer surface. To be specific, when the smooth surface side such as gloss surface of a metal foil and the like is transferred to an adherend, and the metal foil is removed by etching, sufficient conductor peel strength is difficult to achieve even when a conductive layer is formed by electroless plating or electroplating, and the insulating layer surface is inferior in the smoothness to the present invention. On the other hand, when a roughened surface of a metal foil is transferred to an adherend, and the metal foil is removed by etching, the surface of the insulating layer becomes a concave-convex roughened surface, which is disadvantageous for ultrafine wiring even though sufficient conductor peel strength is obtained.

While the layer thickness of a metal film layer is not particularly limited, it is generally 25 nm to 5000 nm, preferably 25 nm to 3000 nm, more preferably 100 nm to 3000 nm, particularly preferably 100 nm to 1000 nm. When the layer thickness is too small, cracks tend to develop easily on the metal film after the production of a film with a metal film. On the other hand, when the layer thickness is too large, formation of metal film requires a long time, which is not preferable from the aspect of cost. When a two-layer structure is formed, from the aspects of broad utility and adhesiveness to resin (peel strength after formation of conductive layer), a two-layer structure of copper layer/chrome layer, nickel-chrome alloy layer or titanium layer is preferable. In this case, the side to be in contact with the curable resin composition layer is a chrome layer, a nickel-chrome alloy layer or a titanium layer. The total layer thickness when such two-layer structure is employed is the same as the above, and thickness of the chrome layer, nickel-chrome layer or titanium layer is preferably 5 nm to 100 nm, more preferably 5 nm to 50 nm, particularly preferably 5 nm to 30 nm, most preferably 5 to 20 nm.

Curable Resin Composition Layer.

The adhesive film with a metal film in the present invention has a structure wherein a curable resin composition layer is formed on a metal film layer of the aforementioned film for metal film layer transcription. That is, the adhesive film with a metal film in the present invention further has a curable resin composition layer in addition to the support layer and the metal film layer. In addition, the adhesive film preferably has a release layer between a support layer and a metal film layer, like the film with a metal film. As the curable resin composition to be used for a curable resin composition layer in the adhesive film with a metal film, any can be used without any particular limitation as long as its cured product has sufficient hardness and insulating property. For example, a composition containing at least a curable resin such as epoxy resin, cyanate ester resin, phenol resin, bismaleimide-triazine resin, polyimide resin, acrylic resin, vinylbenzyl resin and the like and a curing agent thereof can be used. Of these, preferred is a composition containing an epoxy resin as a curable resin, for example, a composition containing at least (a) an epoxy resin, (b) a thermoplastic resin and (c) a curing agent.

Examples of the (a) epoxy resin include bisphenol A type epoxy resin, biphenyl type epoxy resin, naphthol type epoxy resin, naphthalene type epoxy resin, bisphenol F type epoxy resin, phosphorus containing epoxy resin, bisphenol S type epoxy resin, alicyclic epoxy resin, aliphatic chain epoxy resin, phenol novolac type epoxy resin, cresol novolac type epoxy resin, bisphenol A novolac type epoxy resin, epoxy resin having butadiene structure, diglycidyl etherified product of bisphenol, diglycidyl etherified product of naphthalenediol, glycidyl etherified product of phenols, and diglycidyl etherified product of alcohols, and an alkyl substituted product of these epoxy resins, halide and hydrogenated product and the like. Any one kind of these epoxy resins may be used alone or in a combination of two or more kinds.

As the epoxy resin, bisphenol A type epoxy resin, naphthol type epoxy resin, naphthalene type epoxy resin, biphenyl type epoxy resin and epoxy resin having butadiene structure are preferable, from the aspects of heat resistance, insulation reliability and close adhesion to metal films. Specifically, for example, liquid bisphenol A type epoxy resin ("jER828EL" manufactured by Japan Epoxy Resins Co., Ltd.), naphthalene type bifunctional epoxy resin ("HP4032", "HP4032D" manufactured by DIC Corporation), naphthalene type tetrafunctional epoxy resin ("HP4700" manufactured by DIC Corporation), naphthol type epoxy resin ("ESN-475V" manufactured by Tohto Kasei Co., Ltd.), anthraquinone type epoxy resin ("YX8800" manufactured by Japan Epoxy Resins Co., Ltd.), epoxy resin having a butadiene structure ("PB-3600" manufactured by DAICEL CHEMICAL INDUSTRIES, LTD.), epoxy resin having a biphenyl structure ("NC3000H", "NC3000L" manufactured by Nippon Kayaku Co., Ltd., "YX4000" manufactured by Japan Epoxy Resins Co., Ltd.) and the like can be mentioned.

The (b) thermoplastic resin is added to confer adequate flexibility to the composition after curing and the like. Examples of such thermoplastic resin include phenoxy resin, polyvinyl acetal resin, polyimide, polyamide-imide, polyether sulfone, polysulfone and the like. Any one kind of these epoxy resins may be used alone or in a combination of two or more kinds. The thermoplastic resin is preferably added in a proportion of 0.5 to 60 wt %, more preferably 3 to 50 wt %, relative to a nonvolatile component in the curable resin composition as 100 wt %. When the content ratio of the thermoplastic resin is less than 0.5 wt %, the resin composition viscosity becomes low and formation of a uniform curable resin composition layer tends to be difficult. When it exceeds 60 wt %, the viscosity of the resin composition becomes too high, and embedding of the resin composition into the wiring pattern on the substrate tends to be difficult.

Specific examples of the phenoxy resin include FX280, FX293 manufactured by Tohto Kasei Co., Ltd., YX8100, YL6954, YL6974, YL7213, YL6794, YL7482, YL7553, YL7290 manufactured by Japan Epoxy Resins Co., Ltd. and the like.

The polyvinyl acetal resin is preferably a polyvinyl butyral resin. Specific examples of the polyvinyl acetal resin include Denka Butyral 4000-2, 5000-A, 6000-C and 6000-EP manufactured by Denki Kagaku Kogyo Kabushiki Kaisha, S-LEC BH series, BX series, KS series, BL series and BM series manufactured by Sekisui Chemical Co., Ltd., and the like.

Specific examples of the polyimide include polyimide "RIKACOAT SN20" and "RIKACOAT PN20" manufactured by New Japan Chemical Co., Ltd. Moreover, linear polyimide obtained by reacting a bifunctional hydroxyl group-terminated polybutadiene, a diisocyanate compound and tetrabasic acid anhydride (one described in JP-A-2006-37083), a denatured polyimide such as polyimide containing a polysiloxane skeleton (those described in JP-A-2002-12667, JP-A-2000-319386 etc.) and the like can be mentioned.

Specific examples of the polyamide-imide include polyamide-imide "VYLOMAX HR11NN" and "VYLOMAX HR16NN" manufactured by Toyobo Co., Ltd. In addition, a denatured polyamide-imide such as polyamide-imide containing a polysiloxane skeleton such as "KS9100", "KS9300" manufactured by Hitachi Chemical Co., Ltd. and the like can be mentioned.

Specific examples of the polyether sulfone include polyether sulfone "PES5003P" manufactured by Sumitomo Chemical Co., Ltd. and the like.

Specific examples of the polysulfone include polysulfone "P1700", "P3500" manufactured by Solvay Advanced Polymers K.K and the like.

Examples of the (c) curing agent include amine based curing agents, guanidine based curing agents, imidazole based curing agents, triazine skeleton-containing phenolic curing agents, phenolic curing agents, triazine skeleton-containing naphthol based curing agents, naphthol based curing agents, acid anhydride based curing agents, epoxy adducts thereof, microencapsulated products thereof, active ester based curing agents, benzooxazin based curing agents, cyanate ester resins and the like. In the present invention, the curing agent may be used alone or in a combination of two or more kinds thereof. For example, a triazine skeleton-containing phenolic curing agent and a naphthol based curing agent may be used in combination.

Specific examples of the phenolic curing agents and naphthol based curing agents include MEH-7700, MEH-7810, MEH-7851 (manufactured by Meiwa Plastic Industries, Ltd.), NHN, CBN, GPH (manufactured by Nippon Kayaku Co., Ltd.), SN170, SN180, SN190, SN475, SN485, SN495, SN375, SN395 (manufactured by Tohto Kasei Co., Ltd.), TD2090 (manufactured by DIC Corporation) and the like can be mentioned. Specific examples of the triazine skeleton-containing phenolic curing agent include LA3018 (manufactured by DIC Corporation) and the like. Specific examples of the triazine skeleton-containing phenol novolac curing agent include LA7052, LA7054, LA3018, LA1356 (manufactured by DIC Corporation) and the like.

An active ester compound functions as a curing agent of epoxy resins, and generally, a compound having two or more highly reactive ester groups in one molecule such as phenol esters, thiophenol esters, N-hydroxyamine esters, esters of heterocycle hydroxy compound and the like is preferably used. The active ester compound is preferably obtained by a condensation reaction of a carboxylic acid compound and/or thiocarboxylic acid compound with a hydroxy compound and/or thiol compound. Particularly, from the aspects of heat resistance and the like, an active ester compound obtained from a carboxylic acid compound and a phenol compound or naphthol compound is preferable. Examples of the carboxylic acid compound include benzoic acid, acetic acid, succinic acid, maleic acid, itaconic acid, phthalic acid, isophthalic acid, terephthalic acid, pyromellitic acid and the like. Examples of the phenol compound or naphthol compound include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyldiphenol, phenol novolac and the like. The active ester compound to be used may be a combination of two or more kinds. As the active ester compound, one disclosed in JP-A-2004-427761 may be used or a commercially available product may also be used. Examples of the commercially available active ester compound include EXB-9451 and EXB-9460 (manufactured by DIC Corporation), as those having a dicyclopentadienyldiphenol structure, DC808 as acetylated product of phenol novolac, YLH1026 as benzoylated product of phenol novolac (manufactured by Japan Epoxy Resins Co., Ltd.), and the like.

Specific examples of the benzooxazin compound include F-a, P-d (manufactured by SHIKOKU CHEMICALS CORPORATION), HFB2006M (manufactured by SHOWA HIGHPOLYMER CO., LTD.) and the like.

The mixing ratio of the (a) epoxy resin and (c) curing agent when a triazine skeleton-containing phenolic curing agent, a phenolic curing agent, a triazine skeleton-containing naphthol based curing agent or a naphthol based curing agent is used is preferably such a ratio that phenolic hydroxyl group equivalent of the curing agent falls within the range of 0.4 to 2.0, more preferably 0.5 to 1.0, relative to 1 epoxy equivalent of the epoxy resin. When the equivalent ratio of the reaction group is outside this range, the mechanical strength and water resistance of the cured product tend to decrease.

The curable resin composition can further contain, in addition to (c) a curing agent, (d) an accelerator. Examples of such an accelerator include an imidazole based compound, organic phosphine based compound and the like, and specific examples include 2-methylimidazole, triphenylphosphine and the like. When (d) an accelerator is used, it is preferably used in a proportion of 0.1 to 3.0 wt % relative to the epoxy resin.

The curable resin composition may contain (e) an inorganic filler for low thermal expansion of the composition after curing. Examples of the inorganic filler include silica, alumina, isinglass, mica, silicate, barium sulfate, magnesium hydroxide, titanium oxide and the like. Of these, silica and alumina are preferable, and silica such as amorphous silica, fused silica, crystal silica, synthetic silica and the like is particularly preferable. As silica, a spherical one is preferable. From the aspect of insulation reliability, the inorganic filler preferably has an average particle size of not more than 3 μm, more preferably not more than 1.5 μm. The average particle size of an inorganic filler can be measured by the laser diffraction and scattering method based on the Mie scattering theory. Specifically, the particle size distribution of the inorganic filler by volume standard is depicted using a laser diffraction type particle size distribution measurement device, and the median diameter thereof is taken as the average particle size. As a measurement sample, an inorganic filler is dispersed in water by ultrasonication and can be preferably used. As the laser diffraction type particle size distribution measurement device, LA-500 manufactured by HORIBA, Ltd., and the like can be used.

To improve humidity resistance, dispersibility and the like, the inorganic filler may be treated with one or more kinds of surface treating agents, for example, an aminosilane based coupling agent such as aminopropylmethoxysilane, aminopropyltriethoxysilane, ureidopropyltriethoxysilane, N-phenylaminopropyltrimethoxysilane, N-2-(aminoethyl)aminopropyl trimethoxysilane and the like, an epoxy silane based coupling agent such as glycidoxypropyltrimethoxysilane, glycidoxypropyltriethoxysilane, glycidoxypropylmethyldiethoxysilane, glycidyl butyltrimethoxysilane, (3,4-epoxycyclohexyl) ethyltrimethoxysilane and the like, a mercaptosilane based coupling agent such as mercaptopropyltrimethoxysilane, mercaptopropyltriethoxysilane and the like, a silane based coupling agent such as methyltrimethoxysilane, octadecyltrimethoxysilane, phenyltrimethoxysilane, methacryloxypropyltrimethoxysilane, imidazolesilane, triazine silane and the like, an organosilazane compound such as hexamethyldisilasane, hexaphenyldisilasane, dimethylamino trimethylsilane, trisilasane, cyclotrisilasane, 1,1,3,3,5,5-hexamethylcyclotrisilasane and the like, a titanate based coupling agent such as butyl titanate dimer, titanium octyleneglycolate, diisopropoxytitanium bis (triethanolaminate), dihydroxytitanium bislactate, dihydroxybis(ammoniumlactate) titanium, bis(dioctylpyrophosphate) ethylene titanate, bis(dioctylpyrophosphate) oxyacetate titanate, tri-n-butoxy titanium monostearate, tetra-n-butyl titanate, tetra(2-ethylhexyl) titanate, tetraisopropylbis(dioctylphosphite) titanate, tetraoctyl bis(ditridecylphosphite) titanate, tetra(2,2-diallyloxymethyl-1-butyl) bis(ditridecyl)phosphite titanate, isopropyltrioctanoyl titanate, isopropyltricumylphenyl titanate, isopropyl triisostearoyl titanate, isopropyl isostearoyldiacrylic titanate, isopropyldimethacrylisostearoyl titanate, isopropyltri(dioctylphosphate) titanate, isopropyltridodecylbenzenesulfonyl titanate, isopropyltris(dioctylpyrophosphate) titanate, isopropyltri(N-amidoethyl-aminoethyl) titanate, and the like.

The content of the inorganic filler in the curable resin composition is preferably 20 to 80 wt %, more preferably 20 to 70 wt %, when the nonvolatile component of the curable resin composition is 100 wt %. When the content of the inorganic filler is less than 20 wt %, the effect of lowering the coefficient of thermal expansion tends to be exhibited insufficiently, and when the content of the inorganic filler exceeds 80 wt %, the mechanical strength of the cured product tends to decrease and the like.

The curable resin composition of the present invention may contain solid rubber particles to enhance the mechanical strength of cured products, afford a stress relaxation effect and the like. The rubber particles are preferably those that are not dissolved in an organic solvent during preparation of a resin composition, are not compatible with the components in the resin composition such as epoxy resin and the like, and are present in a dispersion state in a varnish made from the resin composition. Such rubber particles are generally prepared by increasing the molecular weight of the rubber component to the extent that prevents dissolution in an organic solvent and resin, and processing the component into particles. As the rubber particles, for example, core-shell type rubber particles, crosslinked acrylonitrile-butadiene rubber particles, crosslinked styrene-butadiene rubber particles, acrylic rubber particles and the like can be mentioned. The core-shell type rubber particles have a core layer and a shell layer and, for example, a two-layer structure wherein the outer shell layer is a glassy polymer, and the inner core layer is a rubber polymer, a three-layer structure wherein the outer shell layer is a glassy polymer, the intermediate layer is a rubber polymer, and the core layer is a glassy polymer, and the like can be mentioned. The glassy layer is comprised of, for example, a methyl methacrylate polymer and the like, and the rubber polymer layer is comprised of, for example, a butylacrylate polymer (butyl rubber) and the like. Specific examples of the core-shell type rubber particles include Stafyloid AC3832, AC3816N, (Ganz Chemical Co., Ltd. trade name) and Metablen KW-4426 (MITSUBISHI RAYON CO., LTD. trade name). Specific examples of the acrylonitrile-butadiene rubber (NBR) particles include XER-91 (average particle size 0.5 μm, manufactured by JSR Corporation) and the like. Specific examples of the styrene-butadiene rubber (SBR) particles include XSK-500 (average particle size 0.5 μm, manufactured by JSR Corporation) and the like. Specific examples of the acrylic rubber particles include Metablen W300A (average particle size 0.1 μm), W450A (average particle size 0.5 μm) (manufactured by MITSUBISHI RAYON CO., LTD.).

The average particle size of the rubber particles to be added is preferably within the range of 0.005 to 1 μm, more preferably 0.2 to 0.6 μm. The average particle size of the rubber particles in the present invention can be measured using the dynamic light scattering method. For example, rubber particles are uniformly dispersed in a suitable organic solvent by ultrasonication and the like, the particle size distribution of the rubber particles by mass standard is depicted using FPRA-1000 (manufactured by Otsuka Electronics Co., Ltd.), and the median diameter thereof is taken as the average particle size.

When rubber particles are added, their content is preferably 1 to 10 mass %, more preferably 2 to 5 mass %, relative to 100 mass % of the nonvolatile component in the resin composition.

The curable resin composition of the present invention may also contain, where necessary, a thermosetting resin other than the epoxy resin, such as a maleimide compound, a bisallylnadiimide compound, a vinylbenzyl resin, a vinylbenzylether resin and the like, as long as the effect of the invention is exhibited. Two or more kinds of such thermosetting resins may be used in a mixture. Examples of the maleimide resin include BMI1000, BMI2000, BMI3000, BMI4000, BMI5100 (all manufactured by DAIWA Industry Co., Ltd.), BMI, BMI-70, BMI-80 (all manufactured by K.I Chemical Industry Co., Ltd.), and ANILIX-MI (manufactured by Mitsui Fine Chemicals, Inc.), examples of the bisallylnadiimide compound include BANI-M, BANI-X (all manufactured by Maruzen Petrochemical Co., Ltd.), examples of the vinylbenzyl resin include V5000 (manufactured by SHOWA HIGHPOLYMER CO., LTD.), and examples of the vinylbenzylether resin include V1000X, V1100X (all manufactured by SHOWA HIGHPOLYMER CO., LTD.).

The curable resin composition of the present invention may contain a flame-retardant as long as the effect of the present invention is exhibited. Two or more kinds of flame-retardants may be used in a mixture. As the flame-retardant, for example, an organic phosphorus flame-retardant, organic nitrogen-containing phosphorus compound, nitrogen compound, silicone flame-retardant, metal hydroxide, and the like can be mentioned. Examples of the organic phosphorus flame-retardant include phosphine compounds such as HCA, HCA-HQ, HCA-NQ manufactured by SANKO CO., LTD., and the like, phosphorus containing benzooxazin compound such as HFB-2006M manufactured by SHOWA HIGHPOLYMER CO., LTD., and the like, phosphoric ester compounds such as Reofos 30, 50, 65, 90, 110, TPP, RPD, BAPP, CPD, TCP, TXP, TBP, TOP, KP140, and TIBP manufactured by Ajinomoto-Fine-Techno Co., Inc., PPQ manufactured by HOKKO CHEMICAL INDUSTRY CO., LTD., OP930 manufactured by Clariant K.K., PX200 manufactured by DAIHACHI CHEMICAL INDUSTRY CO., LTD., and the like, phosphorus containing epoxy resins such as FX289 and FX310 manufactured by Tohto Kasei Co., Ltd., and the like, phosphorus containing phenoxy resins such as ERF001 manufactured by Tohto Kasei Co., Ltd., and the like, and the like. Examples of the organic nitrogen-containing phosphorus compound include phosphoric ester amide compounds such as SP670 and SP703 manufactured by SHIKOKU CHEMICALS CORPORATION, and the like, phosphagen compounds such as SPB100 and SPE100 manufactured by Otsuka Chemical Co., Ltd., and the like, and the like. As the metal hydroxide, magnesium hydroxide such as UD65, UD650, and UD653 manufactured by Ube Material Industries, Ltd., and the like, aluminum hydroxide such as B-30, B-325, B-315, B-308, B-303, and UFH-20 manufactured by TOMOE ENGINEERING CO., LTD., and the like, and the like can be mentioned.

The curable resin composition of the present invention may optionally contain various resin additives other than those mentioned above as long as the effect of the invention is exhibited. As the resin additive, for example, organic fillers such as silicone powder, nylon powder, fluorine powder, and the like, thickeners such as orben, benton and the like, silicone-based, fluorine-based and polymer-based antifoaming agents or leveling agents, tackifiers such as silane coupling agents, triazole compounds, thiazole compounds, triazine compounds, porphyrin compounds, and the like, colorants such as phthalocyanine-blue, phthalocyanine-green, iodine-green, disazo yellow, carbon black and the like, and the like can be mentioned.

The curable resin composition layer may be a prepreg comprised of a sheet-like reinforcing substrate made of fiber and impregnated with the aforementioned curable resin composition. As the fiber of the sheet-like reinforcing substrate, one conventionally used as a fiber for prepreg such as glass cloth, aramid fiber and the like can be used. The prepreg can be formed by impregnating a sheet-like reinforcing substrate with the curable resin composition by a hot-melt method or solvent method, and partially curing same by heating. According to the hot-melt method, a prepreg is produced by once coating, without dissolving a resin composition in an organic solvent, a resin composition to a coated paper showing good release property from the resin composition and laminating same on a sheet-like reinforcing substrate, or directly coating same with a die coater and the like. According to the solvent method, a sheet-like reinforcing substrate is immersed in a varnish obtained by dissolving a resin composition in an organic solvent to allow the sheet-like reinforcing substrate to be impregnated with the resin composition varnish, and dried thereafter.

In the adhesive film with a metal film to be used in the present invention, the thickness of a curable resin composition layer varies depending on the thickness of an internal-layer circuit conductive layer and the like. From the aspects of insulation reliability between layers, and the like, about 10 to 150 μm is preferable and 15 to 80 μm is more preferable.

While the production method of the film with a metal film and the adhesive film with a metal film of the present invention is not particularly limited, the following method is preferable.

As to a film with a metal film, for example, a metal film layer is formed on a support layer. When a release layer is to be formed, it is formed on the support layer surface before formation of these metal layers. When a release layer is to be formed, a metal film layer is formed on the release layer surface.

A method of forming a release layer is not particularly limited, and a known lamination method such as hot press, hot roll laminating, extrusion laminating, applying and drying of a coating solution and the like can be employed. A method including applying and drying a coating solution containing a material to be used for a release layer is preferable, since it is convenient and a layer having highly uniform property can be easily formed and the like.

A metal film is preferably formed by one or more kinds of methods selected from a vapor deposition method, a sputtering method and an ion plating method, particularly preferably formed by a vapor deposition method and/or a sputtering method. These methods can be used in combination, but generally, any of the methods is used alone.

As the vapor deposition method (vacuum deposition method), a known method can be used. For example, a support is placed in a vacuum chamber, and a metal is vaporized by heating to form a film on a support (on a release layer when it is present).

The sputtering method may be a known method comprising, for example, placing a support in a vacuum chamber, introducing an inert gas such as argon and the like, and applying a direct voltage to cause collision of ionized inert gas with a target metal, thus forming a film of the sputtered metal on a support (on a release layer when it is present).

The ion plating method may also be a known method comprising, for example, placing a support in a vacuum chamber, and heating and vaporizing a metal under a glow discharge atmosphere, thus forming a film of the vaporized ionized metal on a support (on a release layer when it is present).

An adhesive film with a metal film can be produced by forming, after a step of forming a metal film layer of a film with a metal film, a curable resin composition layer on the metal film layer surface. For formation of the curable resin composition layer, a known method can be used. For example, the film can be produced by dissolving a resin composition in an organic solvent to give a resin varnish, applying the resin varnish on a metal film layer of a film with a metal film by a die coater and the like, and evaporating the organic solvent by heating or blowing hot air and the like to form a resin composition layer.

As the organic solvent, for example, ketones such as acetone, methylethyl ketone, cyclohexanone, and the like, acetic esters such as ethyl acetate, butyl acetate, cellosolve acetate, propylene glycol monomethylether acetate, carbitol acetate, and the like, carbitols such as cellosolve, butyl carbitol, and the like, aromatic hydrocarbons such as toluene, xylene, and the like, dimethylformamide, dimethylacetamide, N-methylpyrrolidone, and the like, and the like can be mentioned. Two or more kinds of organic solvents may be used in combination.

While the drying conditions are not particularly limited, the film is dried so that the content of the organic solvent in the resin composition layer will be generally not more than 10 wt %, preferably not more than 5 wt %. While subject to variation depending on the amount of the organic solvent in a varnish and the boiling point of the organic solvent, for example, a varnish containing 30 to 60 wt % of an organic solvent can be dried at 50 to 150° C. for about 3 to 10 minutes to form a resin composition layer.

Alternatively, an adhesive film with a metal film can also be prepared by a method comprising preparing, separately from a film with a metal film, an adhesive film having a curable resin composition layer formed on a support layer, and adhering the film with a metal film to the adhesive film under heating conditions such that the curable resin composition layer comes into contact with the metal film layer. The adhesive film can be produced by a known method, and a support layer and a curable resin composition layer therefor to be applied are those mentioned above. When an adhesive film with a metal film wherein the curable resin composition layer is a prepreg is to be obtained, the adhesive film can be prepared by laminating a prepreg on a support layer by, for example, a vacuum laminating method.

A film with a metal film and an adhesive film are adhered by laying them on top of each other in such a manner that a metal film layer of the film with a metal film faces a curable resin composition layer of the adhesive film, and thermocompression-bonding them by hot press, hot roll and the like. The heating temperature is preferably 60 to 140° C., more preferably 80 to 120° C. The pressure of the compression-bonding is preferably within the range of 1 to 11 kgf/cm$^2$ ($9.8\times10^4$ to $107.9\times10^4$ N/m$^2$), particularly preferably within the range of 2 to 7 kgf/cm$^2$ ($19.6\times10^4$ to $68.6\times10^4$ N/m$^2$).

Production of Multilayer Printed Wiring Board by Using a Film with a Metal Film.

The production method of a multilayer printed wiring board using a film with a metal film in the present invention comprises at least the following steps (A)-(E).

(A) a step of laminating a film with a metal film, wherein a metal film layer is formed on a support layer, on an internal-layer circuit substrate via a curable resin composition layer, or laminating an adhesive film with a metal film, wherein a curable resin composition layer is formed on a metal film layer of the film with a metal film, on an internal-layer circuit substrate, (B) a step of curing a curable resin composition layer to form an insulating layer, (C) a step of removing a support layer, (D) a step of removing a metal film layer, and (E) a step of forming a metal film layer on an insulating layer surface by electroless plating.

The "internal-layer circuit substrate" in the present invention refers to an intermediate product having a conductive layer pattern processed (circuit formed) on one or both surfaces of a glass epoxy substrate, a metal substrate, a polyester substrate, a polyimide substrate, a BT resin substrate, a thermosetting polyphenylene ether substrate or the like, on which an insulating layer and a conductive layer are further formed for the production of a circuit board.

In step (A), when an adhesive film with a metal film is used, it only needs to be laminated on an internal-layer circuit substrate using a curable resin composition layer as an adhesive surface. On the other hand, when a film with a metal film is used, the film is laminated such that the metal film layer comes into contact with the surface of a curable resin composition layer present between the film with a metal film and the internal-layer circuit substrate and then laminated. In this case, the curable resin composition layer can be formed on an internal-layer circuit substrate by a known method and, for example, formed by laminating, on an internal-layer circuit substrate, an adhesive film wherein a curable resin composition layer is formed on a support layer as mentioned above, and removing the support layer by detaching and the like. In this case, the laminating conditions of the adhesive film are similar to those of the below-mentioned adhesive film with a metal film. When a prepreg is used as a curable resin composition layer, a film with a metal film can be laminated on a prepreg, which is a surface layer of one side or both sides of a laminate wherein a single prepreg or a multilayer prepreg comprising plural prepregs laid on top of each other to give a multilayered prepreg is laminated on an internal-layer circuit substrate, such that the metal film layer thereof comes into contact with the prepreg surface.

For lamination of an adhesive film with a metal film or a film with a metal film, a film is laminated on an adherend surface by a roll or press compression-bonding etc. since workability and uniform contact state are easily achieved. In particular, lamination is preferably performed by a vacuum laminating method under reduced pressure. Moreover, the lamination method may be a batch system or a continuous system using a roll.

The heating temperature is preferably 60 to 140° C., more preferably 80 to 120° C. The pressure of the compression-bonding is preferably within the range of 1 to 11 kgf/cm$^2$ ($9.8\times10^4$ to $107.9\times10^4$ N/m$^2$), particularly preferably within the range of 2 to 7 kgf/cm$^2$ ($19.6\times10^4$ to $68.6\times10^4$ N/m$^2$). The air pressure for lamination is preferably under reduced pressure of 20 mmHg (26.7 hPa) or below.

Vacuum lamination can be performed using a commercially available vacuum laminator. As the commercially available vacuum laminator, for example, the vacuum pressure laminator MVLP-500 manufactured by Meiki Co., Ltd., Vacuum Applicator manufactured by Nichigo-Morton Co., Ltd., Rolling Dry Coater manufactured by Hitachi Industries Co., Ltd., the vacuum laminator manufactured by Hitachi AIC Inc., and the like can be mentioned.

In step (B), a curable resin composition layer is cured to form an insulating layer, which is generally performed by a heat curing treatment. While the curing conditions vary depending on the kind of the curable resin and the like, the curing temperature is generally 120 to 200° C. and the curing time is 15 to 90 min. Step-like curing from a comparatively low curing temperature to a high curing temperature, or curing while raising the temperature is preferable for preventing wrinkles on the surface of the insulating layer to be formed.

The support layer is generally removed in step (C) manually or mechanically by an automatic detaching apparatus. When a metal foil is used as a support layer, the support layer can also be removed by etching. The support layer is detached after formation of the insulating layer by a curing treatment of a curable resin composition layer. When a support layer is detached before a curing treatment, inconveniences tend to occur such as insufficient transfer of a metal film layer, cracks developed in a metal film layer after curing of a curable resin composition and the like.

When the release layer is present between a support layer and a metal film layer, and the release layer remains on a metal film layer after removal of the support layer, the release layer is removed. When a step of forming a blind via is performed, removal of the support layer (removal of the support layer and the release layer when the release layer remains on the metal film layer) may be performed before or after a step of forming a blind via. Generally, it is preferably before formation of the blind via. As to removal of the release layer, for example, a metal release layer is removed by an etchant that dissolves the metal, and a water-soluble polymer release layer can be removed by an aqueous solution.

When a water-soluble polymer comprising one or more kinds selected from a water-soluble cellulose resin, a water-soluble acrylic resin and a water-soluble polyester resin is employed as a release layer, a support layer can be released between support layer—release layer after curing of a curable resin composition, which is an adherend, and thereafter, the release layer remaining on the metal film layer can be conveniently removed with an aqueous solution. The aqueous solution for dissolving and removing the release layer preferably includes, for example, an alkaline aqueous solution obtained by dissolving sodium carbonate, sodium hydrogen carbonate, sodium hydroxide, potassium hydroxide and the like in water at a concentration of 0.5 to 10 wt % and the like. Although not generally necessity, the aqueous solution may contain alcohol such as methanol, ethanol, isopropyl alcohol and the like as long as it causes no problem for the production of a circuit substrate and the like. The method of removal by dissolution is not particularly limited and, for example, a method including detaching a support layer and immersing the substrate in an aqueous solution to allow removal by dissolution, a method including blowing an aqueous solution in spray or mist against the release layer for removal by dissolution, and the like can be mentioned. The temperature of the aqueous solution is generally room temperature to about 80° C., and the time of treatment with an aqueous solution such as immersion in water, blowing and the like is generally 10 seconds to 10 minutes. As the alkaline aqueous solution, an alkaline type developer (e.g., 0.5 to 2 wt % aqueous sodium carbonate solution, 25 to 40° C.) for alkaline developing machines, a removing solution (e.g., 1 to 5 wt % aqueous sodium hydroxide solution, 40 to 60° C.) for dry film peeling machines, a swelling solution (e.g., alkaline aqueous solution containing sodium carbonate, sodium hydroxide or the like, 60 to 80° C.) used in a desmear step, and the like can be used, which are used for the production of a multilayer printed wiring board.

The metal film layer is removed in step (D) by removal by etching with a solution that dissolves the metal forming the metal film layer. The metal film layer is generally removed by etching after a drilling step and, where necessary, a desmear step. As etchant, a known solution is selected according to the metal layer selected and, for example, an acidic etchant such as aqueous ferric chloride solution, an aqueous solution of sodium peroxodisulfate and sulfuric acid and the like, an alkaline etchant such as CF-6000 manufactured by MEC COMPANY LTD., E-PROCESS-WL manufactured by Meltex Inc. and the like can be used for copper. For nickel, an etchant containing nitric acid/sulfuric acid as main component(s) can be used. As a commercially available product, NH-1865 manufactured by MEC COMPANY LTD., MEL-STRIP N-950 manufactured by Meltex Inc., and the like can be mentioned. When a release layer remains on a metal film layer and the release layer and the metal film layer can be removed simultaneously, they may be removed simultaneously. The arithmetic mean roughness (Ra) of the insulating layer surface after removal of the metal film layer is preferably not more than 200 nm, more preferably not more than 80 nm, more preferably not more than 70 nm, and more preferably not more than 60 nm, from the aspect of ultrafine wiring. The arithmetic mean roughness (Ra value) can be measured by a known method and using, for example, an apparatus such as noncontact surface roughness meter (e.g., WYKO NT3300 manufactured by Veeco Instruments, etc.) and the like.

The (E) step of forming a metal film layer on an insulating layer surface by electroless plating can be performed by a known method. For example, an insulating layer surface is treated with a surfactant etc., a plating catalyst such as palladium and the like is applied, and the surface is immersed in an electroless plating solution, whereby a metal film layer can be formed. As the metal film layer, copper, nickel, gold, palladium and the like can be mentioned, with preference given to copper. In addition, the thickness thereof is preferably 0.1 to 5.0 μm. From the aspects of sufficient coating of a resin surface and the cost, the thickness is generally about 0.2 to 2.5 μm, preferably about 0.2 to 1.5 μm. The above-mentioned metal film layer may also be formed according to a direct plating method, which is one kind of electroless plating.

After such step of forming a metal film layer on an insulating layer surface by electroless plating (step (E)), the metal film layer is utilized to form a conductive layer by electroplating. Such a conductive layer can be formed by a known method such as semi-additive process etc. For example, a plating resist is formed, and using, as a plating seed layer, the above-mentioned metal film layer by electroless plating, a conductive layer is formed by electroplating (step (H)). The conductive layer by electroplating (electroplating layer) is preferably copper, and the thickness thereof varies depending on the design of desired multilayer printed wiring board, which is generally 3 to 35 μm, preferably 5 to 30 μm. After electroplating, the plating resist is removed with a plating resist-removing solution such as alkaline aqueous solution and the like, and the plating seed layer is removed, whereby a wiring pattern is formed. The plating seed layer (metal film layer by electroless plating) can be removed by a method similar to that for removing the aforementioned metal film (step (D) removal of metal film layer).

In the production method of a multilayer printed wiring board of the present invention, a blind via or a through hole may be formed according to a known method. In an insulating layer built-up in a multilayer printed wiring board, layers are generally conducted therebetween by a blind via. While a through-hole is generally formed in a core substrate, a through-hole may be formed after forming an insulating layer. In this case, a treatment similar to a desmear step (e.g., desmear treatment with an oxidizing agent to be mentioned later) can be applied to a through-hole. For through-hole formation, a mechanical drill is generally used, and for blind via formation, a laser such as carbon dioxide gas laser, YAG laser and the like is generally used.

In the method of the present invention, (F) a step of forming a blind via can be performed on from the support layer before removing the support layer (that is, after (B) a step of curing a curable resin composition layer to form an insulating layer and before C) a step of removing the support layer), when the support layer is a plastic film. In addition, when the release layer remains after removal of the support layer, it can also be performed on from the release layer (that is, after C) a step of removing a support layer). In addition, the blind via is preferably formed before removal of the metal film layer. While a blind via may be formed after removal of the metal film, when desmear process of a blind via is performed by a treatment with an oxidizing agent such as an alkaline permanganate solution and the like, and the like, the insulating layer surface is roughened. Therefore, formation of a blind via after removal of the metal film layer is not preferable for ultrafine wiring. When a blind via is formed by a laser on from the support layer or release layer, a laser absorbing component may be contained in the support layer and/or the release layer to improve laser processability. Examples of the laser absorbing component include a metal compound powder, a carbon powder, a metal powder, a black dye and the like. The amount of the laser energy-absorbing component to be blended is generally 0.05 to 40 wt %, preferably 0.1 to 20 wt %, more preferably 1 to 10 wt %, of the total components constituting the layer containing the component. For example, when the component is contained in the release layer formed from a water-soluble resin, it is preferably blended at the above-mentioned content where the total content including the water-soluble resin and the component is 100 wt %. Examples of the carbon powder include powders of carbon black such as furnace black, channel black, acetylene black, thermal black, anthracene black and the like, black lead powder, a mixed powder thereof and the like. Examples of the metal compound powder include titanias such as titanium oxide and the like, magnesias such as magnesium oxide and the like, oxides of iron such as iron oxide and the like, oxides of nickel such as nickel oxide and the like, manganese dioxide, oxides of zinc such as zinc oxide and the like, silicon dioxide, aluminum oxides, oxides of rare earth, oxides of cobalt such as cobalt oxide and the like, oxides of tin such as tin oxide and the like, oxides of tungsten such as tungsten oxide and the like, silicon carbide, tungsten carbide, boron nitride, silicon nitride, titanium nitride, aluminum nitride, barium sulfate, sulfates of rare earth acid, or a mixed powder thereof and the like. Examples of the metal powder include silver, aluminum, bismuth, cobalt, copper, iron, magnesium, manganese, molybdenum, nickel, palladium, antimony, silicon, tin, titanium, vanadium, tungsten, zinc, alloys of these, a mixed powder and the like. Examples of the black dye include azo (monoazo, disazo etc.) dye, azo-methine dye, anthraquinone type dye, quinoline dye, ketone-imine dye, fluorone dye, nitro dye, xanthene dye, acenaphthene dye, quinophthalone dye, aminoketone dye, methine dye, perylene dye, coumarin dye, perinone dye, triphenyl dye, triallylmethane dye, phthalocyanine dye, inkro-phenol dye, azine dye, a mixture thereof and the like. The black dye is preferably a solvent-soluble black dye which improves dispersibility in a water-soluble resin. Such laser energy-absorbing components may be used alone or in a mixture of different kinds thereof. As the laser energy-absorbing component, carbon powder is preferable, and carbon black is particularly preferable, from the aspects of conversion efficiency of laser energy to heat, broad utility, and the like.

The desmear step of step (G) can be performed by a known method such as a dry process including plasma and the like, a wet process by an oxidizing agent treatment using an alkaline permanganate solution and the like, and the like. The desmear step is a step of removing a via bottom residue mainly resulting from blind via formation, and is sometimes performed to roughen the via wall surface. Particularly, a desmear process with an oxidizing agent is preferable since it removes the smear on the via bottom and simultaneously roughens the via wall surface with the oxidizing agent to improve the plating adhesion strength. When the blind via is formed on from a support layer, the desmear step can also be performed before detachment of the support layer. Generally, it is preferably performed after detachment of the support layer (when release layer remains, after removal of the release layer). As mentioned above, to prevent the insulating layer surface from being roughened, the desmear step is preferably performed at least before a step of removing a metal film layer. A desmear step with an oxidizing agent is generally performed by conducting a swelling treatment with a swelling solution, a roughening treatment with an oxidizing agent and a neutralization treatment with a neutralizing solution in this order. Examples of the swelling solution include alkaline solution, surfactant solution and the like, with preference given to alkaline solution. Examples of the alkaline solution include sodium hydroxide solution, potassium hydroxide solution and the like. Examples of the commercially available swelling solution include Swelling Dip Securiganth P, Swelling Dip Securiganth SBU manufactured by ATOTECH Japan K.K., and the like. Examples of the oxidizing agent include an alkaline permanganate solution obtained by dissolving potassium permanganate or sodium permanganate in an aqueous solution of sodium hydroxide. A roughening treatment with an oxidizing agent such as alkaline permanganate solution and the like is generally performed by immersing the laminate in an oxidizing agent solution heated to about 60° C. to 80° C. for about 10 minutes to 30 minutes. In addition, the concentration of the permanganate in an alkaline permanganate solution is generally about 5 to 10 wt %. Examples of the commercially available oxidizing agent include an alkaline permanganate solution such as Concentrate Compact CP, and Dosing Solution Securiganth P manufactured by ATOTECH Japan K.K., and the like. In addition, as the neutralizing solution, an acidic aqueous solution is preferable, and examples of the commercially available product include Reduction Solution Securiganth P (neutralizing solution) manufactured by ATOTECH Japan K.K.

In a blind via forming step such as laser and the like, a part free of a metal film layer is formed around the via. In a desmear step, however, a concave convex roughened surface can be formed by a roughening treatment of the part free of a metal film layer around the via. The part around the via does not require etching during formation of a circuit. By providing a roughened surface around the via, close adhesion to the subsequent electroless plating becomes stronger, thus enhancing the connection reliability of the blind via.

When the metal film layer is removed by etching in step (D) after the above-mentioned desmear step, the base metal layer surface of the via bottom can also be etched simultaneously. By etching the base metal layer surface of the via bottom, the smear on the via bottom can be removed more completely. For example, when the metal of the metal film layer and base metal layer of the via bottom is copper, etching of the copper film layer and removal of the smear by etching of the base copper layer surface of the via bottom can be performed simultaneously with a copper etching solution.

As is clear from the below-mentioned Examples, the method of the present invention enables formation of a conductive layer superior in peel strength on an extremely smooth insulating layer surface having an arithmetic mean roughness (Ra) of not more than 200 nm. While the reason for providing such effect in the present invention is not clear, the surface of a product of a curable resin composition cured with a metal film layer (i.e., after lamination of a metal film layer) and after removal of the metal film layer, and the surface of a product of a curable resin composition cured without a metal film layer (i.e., without lamination of a metal film layer) were subjected to the measurement of the atom concentration by an X-ray photoelectron spectrometer to find that the hetero atom concentration represented by the nitrogen atom on the insulating layer surface is higher in the former (see Table 3 to be shown later). Therefore, the curable resin composition of the present invention preferably contains a component containing a hetero atom in a molecule, and particularly preferably contains a component containing a nitrogen atom. While a curable resin composition containing an epoxy resin and a curing agent generally contains a component comprising a hetero atom as an epoxy resin and/or a curing agent, a curing agent comprising nitrogen atom in a molecule such as an amine based curing agent, a guanidine based curing agent, an imidazole based curing agent, a triazine skeleton-containing phenolic curing agent, a triazine skeleton-containing naphthol based curing agent, an epoxy adduct and a microencapsulated product thereof, a benzooxazin based curing agent, a cyanate ester resin and the like are preferably used as curing agents that ensure particularly preferable orientation. Particularly, a triazine skeleton-containing phenol novolac resin and/or a triazine skeleton-containing cresol novolac resin are preferably used. Since the peel strength is not improved solely by simply increasing the content of a component containing a nitrogen atom in an insulating layer, it is assumed that adhesion to a conductive layer is not exhibited merely due to an increased concentration of the nitrogen atom, but strong adhesion of a plating conductive layer is exhibited because curing of a curable resin composition with a metal film layer being adhered causes orientation of a molecule, particularly a molecule containing a hetero atom substituted by nitrogen, contained in the composition in a state preferable for close adhesion of the metal film, and such state is also maintained in a plating step. With a copper foil, such effect is not obtained.

As mentioned above, representative multilayer printed wiring boards obtained by the production method of the present invention have a conductive layer formed on an insulating layer surface having an arithmetic mean roughness (Ra) of not more than 200 nm, and are characterized in that, for example, the nitrogen atom concentration measured by an X-ray photoelectron spectrometer is higher in the insulating layer surface than that of other parts (for example, insulating layer lower part).

Other features of the invention will become apparent in the course of the following descriptions of exemplary embodiments which are given for illustration of the invention and are not intended to be limiting thereof.

EXAMPLES

In the following descriptions, "parts" means "parts by weight".

Example 1

Preparation of Film with Metal Film

To a 38 μm-thick poly(ethylene terephthalate) (hereinafter to be also abbreviated as "PET") film was applied a 1:1 solution (solid content 10 wt %) of hydroxypropylmethylcellulose phthalate ("HP-55" manufactured by Shin-Etsu Chemical Co., Ltd.) in methyl ethyl ketone (hereinafter to be abbreviated as "MEK") and N,N-dimethylformamide (hereinafter to be abbreviated as "DMF") (that is, a solution using a mixed solvent of MEK and DMF in a mass ratio of 1:1) with a bar coater. The solvent was removed by raising the temperature from room temperature to 140° C. at a temperature rise rate of 3° C./second in a hot air drying oven to form a hydroxypropylmethylcellulose phthalate layer (about 1 μm) on the PET film. Then, a copper layer (about 500 nm) was formed on the hydroxypropylcellulose phthalate layer by vapor deposition to give a film with a metal film.
Preparation of Adhesive Film Having Curable Resin Composition Layer.

A liquid bisphenol A type epoxy resin (epoxy equivalent 180, "Epikote 828EL" manufactured by Japan Epoxy Resins Co., Ltd., 28 parts), a naphthalene type tetrafunctional epoxy resin (epoxy equivalent 163, "HP4700" manufactured by DIC Corporation, 28 parts), and a phenoxy resin ("YX6954BH30" manufactured by Japan Epoxy Resins Co., Ltd., 20 parts) were dissolved by stirring with heating in MEK (15 parts) and cyclohexanone (15 parts). Thereto were added a triazine-containing phenol novolac resin (hydroxyl group equivalent 125, "LA7054" manufactured by DIC Corporation, nitrogen content about 12 wt %, 27 parts), an MEK solution (27 parts, solid content 50 wt %) of a naphthol-based curing agent (hydroxyl group equivalent 215, "SN-485" manufactured by Tohto Kasei Co., Ltd.), a curing catalyst ("2E4MZ" manufactured by SHIKOKU CHEMICALS CORPORATION, 0.1 part), spherical silica (average particle size 0.5 μm, "SOC2" manufactured by Admatechs Company Limited, 70 parts), and a 1:1 solution (30 parts, solid content 15 wt %) of a polyvinyl butyral resin ("KS-1" manufactured by SEKISUI CHEMICAL CO., LTD.)) in ethanol and toluene, and the mixture was uniformly dispersed in a high-speed rotary mixer to give a resin varnish. The above-mentioned varnish was applied to a polyethylene terephthalate) film (manufactured by LINTEC Corporation) with a 38 μm-thick alkyd type release agent (AL-5, manufactured by LINTEC Corporation) with a die coater, and the solvent was removed using a hot air drying oven to give an adhesive film having a 40 μm-thick curable resin composition layer. The nitrogen content relative to the solid content then was about 1.2 wt %.
Preparation of Adhesive Film with Metal Film.

The above-mentioned adhesive film and the film with a metal film were adhered and wound at 90° C. such that the curable resin composition surface of the adhesive film contacted the metal film surface of the film with a metal film to give an adhesive film with a metal film.
Lamination and Curing of Adhesive Film with Metal Film on Internal-Layer Circuit Substrate>.

A glass epoxy substrate having a circuit formed from a 18 μm-thick copper layer was subjected to a treatment with CZ8100 (surface treating agent containing azole-copper complex and organic acid (manufactured by MEC COMPANY LTD.)) to roughen the copper layer. Then, a releasing PET of the above-mentioned adhesive film with a metal film was detached, the film was placed such that the curable resin composition layer contacted the copper circuit surface, and the films were laminated on both sides of the substrate by a batch system vacuum-pressurization laminating machine MVLP-500 (manufactured by Meiko Co., Ltd., trade name). The lamination was performed for 30 seconds under reduced pressure at an atmospheric pressure of not more than 13 hPa. Thereafter, the laminate was heat-cured at 160° C. for 30 minutes to form an insulating layer.
Formation of Blind Via.

A blind via (top opening diameter about 65 μm) was formed on from the support layer in the above-mentioned substrate by a carbon dioxide gas laser manufactured by Hitachi Via Mechanics, Ltd. under the conditions of output 0.6 W, pulse width 3 μs and shot number 2.
Removal of Support Layer and Release Layer, and Desmear Treatment.

The PET film (support layer) was detached from the substrate with the blind via, and the hydroxypropylmethylcellulose phthalate layer was removed by dissolving with 1 wt % aqueous sodium carbonate solution. Then, as a desmear step, it was immersed in Swelling Dip Securiganth P (swelling solution manufactured by ATOTECH Japan K.K.) at 80° C. for 10 minutes, then Concentrate Compact P (aqueous solution of $KMnO_4$: 60 g/L, NaOH: 40 g/L, roughening solution manufactured by ATOTECH Japan K.K.) at 80° C. for 20 minutes, and lastly, Reduction Solution Securiganth P (neutralizing solution manufactured by ATOTECH Japan K.K.) at 40° C. for 5 minutes. Thereafter, the laminate was washed with water and dried. The via bottom was observed with SEM to find no residue.
Removal of Metal Film Layer by Etching and Etching of Base Metal Layer Surface of Via Bottom.

The substrate after the above-mentioned treatment for removal of the residue was immersed in an aqueous ferric chloride solution at 25° C. for 2 minutes to remove the copper film layer from the insulating layer by etching and perform etching of the copper layer surface of the via bottom. It was washed with water and dried. The absence of the copper film layer on the insulating layer was visually confirmed.
Formation of Conductive Layer.

The insulating layer after etching of the above-mentioned copper film layer was subjected to copper electroless plating (by a copper electroless plating process using an agent solution manufactured by ATOTECH Japan K.K., detailedly described in the following). The film thickness of the copper electroless plating became about 1 μm. Thereafter, copper electroplating was performed to form a conductive layer (copper layer) having a total thickness of about 30 μm, whereby a multilayer printed wiring board was obtained.

Copper Electroless Plating Process Using Agent Solution Manufactured by ATOTECH Japan K.K.

1. Alkaline cleaning (washing of resin surface and charge-tuning)
trade name: Cleaning cleaner Securiganth 902
condition: 60° C. for 5 minutes
2. Soft etching (washing of copper of via bottom, conductor)
aqueous sulfuric acid acidic sodium peroxodisulfate solution
condition: 30° C. for 1 minute
3. Pre-dip (for charge-tuning of surface for attachment of Pd in next step)
trade name: Pre. Dip Neoganth B
condition: room temperature for 1 minute
4. Activator (attachment of Pd to resin surface)
trade name: Activator Neoganth 834
condition: 35° C. for 5 minutes
5. Reduction (reduction of resin attached to Pd)
trade name: Reducer Neoganth WA: mixture of Reducer Accelerator 810 mod.
condition: 30° C. for 5 minutes
6. Copper electroless plating (precipitation of Cu on resin surface (Pd surface))
trade name: Basic Solution Printganth MSK-DK, a mixture of
: Copper solution Printganth MSK
: Stabilizer Printganth MSK-DK
: Reducer Cu
condition: 35° C. for 20 minutes Example 2

An operation similar to that in Example 1 except that the content of the spherical silica in the adhesive film having the curable resin composition layer described in Example 1 was changed to 150 parts was performed to give a multilayer printed wiring board.

Example 3

An operation similar to that in Example 1 except that the etchant for the copper layer on the insulating resin layer and the base copper layer used in Example 1 were changed to a mixture of sodium peroxodisulfate (100 g), sulfuric acid (20 ml) and ion exchange water (938.4 ml) was performed to give a multilayer printed wiring board.

Example 4

An operation similar to that in Example 1 except that the via was formed by a UV-YAG laser 5300 manufactured by ESi and the desmear treatment was not performed was performed to give a multilayer printed wiring board.

Example 5

An operation similar to that in Example 1 except that an adhesive film with a metal film obtained by using, instead of the film with a metal film used in Example 1, a film with a metal film having the metal film layer laminated by sputtering was performed to give a multilayer printed wiring board.

Example 6

In the same manner as in Example 1 except that the adhesive film having the curable resin composition layer described in Example 1 was changed to the following, a multilayer printed wiring board was prepared.

Preparation of Adhesive Film Having Curable Resin Composition Layer.

A liquid bisphenol A type epoxy resin (epoxy equivalent 180, "jER828EL" manufactured by Japan Epoxy Resins Co., Ltd., 30 parts), and a biphenyl type epoxy resin (epoxy equivalent 291, "NC3000H" manufactured by Nippon Kayaku Co., Ltd., 30 parts) were dissolved by stirring with heating in methyl ethyl ketone (hereinafter to be abbreviated as "MEK", 15 parts) and cyclohexanone (15 parts). Thereto were added an active ester compound ("EXB9460-65T" manufactured by DIC Corporation, active ester equivalent 223, a toluene solution of solid content 65%, 80 parts), an accelerator ("4-dimethylamino pyridine" manufactured by KOEI CHEMICAL CO., LTD., 0.5 part), spherical silica (average particle size 0.5 μm, "SO-C2" with amino silane treatment, manufactured by Admatechs Company Limited, 120 parts), and a phenoxy resin ("YL7213BH30" manufactured by Japan Epoxy Resins Co., Ltd., 40 parts), and the mixture was uniformly dispersed in a high-speed rotary mixer to give a resin varnish.

The physical property evaluations in the above-mentioned Examples and the following Comparative Examples were performed according to the following methods.

Measurement of Peel Strength of Conductive Layer.

The peel strength of the conductive layer was determined according to JIS C6481. The thickness of the conductor was set to about 30 μm.

Measurement of Surface Roughness of Insulating Layer.

The surface roughness of the insulating layer was measured by removing the copper plating layer and the metal film layer on the prepared multilayer printed wiring board with a copper etchant, and measuring the Ra (arithmetic mean roughness) of the surface of the insulating layer using a non-contact type surface roughness meter (WYKO NT3300 manufactured by Veeco Instruments Inc.) at VSI contact mode with the range of measurement with 50× lens of 121 μm×92 μm.

Comparative Example 1

Instead of the film with a metal film used in Example 1, the same curable resin composition layer as in Example 1 was formed on the surface-treated surface (smooth surface) of an ultra-flat electrolytic copper foil ("NA-DFF", manufactured by MITSUI MINING & SMELTING CO., LTD., 9 μm) to give an adhesive film with a copper foil. An operation similar to that in Example 1 except that said adhesive film with copper foil was used was performed to give a multilayer printed wiring board. After copper electroless plating and copper electroplating, inconveniences such as blisters and the like did not occur, but the peel strength was as low as about 0.1 kgf/cm.

Comparative Example 2

Instead of the film with a metal film used in Example 1, the same curable resin composition layer as in Example 1 was formed on a mat-treated surface of an electrolytic copper foil ("JTC foil" manufactured by Nikko Materials Co., Ltd., 18 μm) to give an adhesive film with a copper foil. An operation similar to that in Example 1 except that said adhesive film with copper foil was used was performed to give a multilayer printed wiring board. After copper electroless plating and copper electroplating, inconveniences such as blisters and the like did not occur and the peel strength was as high as about 0.9 kgf/cm, but Ra was as high as not less than 1000 nm.

Comparative Example 3

Instead of the film with a metal film used in Example 1, the same curable resin composition layer as in Example 1 was formed on a gloss surface of an electrolytic copper foil ("JTC foil" manufactured by Nikko Materials Co., Ltd., 18 μm) to give an adhesive film with a copper foil. An operation similar to that in Example 1 except that said adhesive film with copper foil was used was performed. After copper electroless plating, however, many blisters were produced, and therefore, subsequent evaluation was not performed.

Comparative Example 4

A glass epoxy substrate having a circuit formed from a 18 μm-thick copper layer was subjected to a treatment with CZ8100 (surface treating agent containing azole-copper complex and organic acid (manufactured by MEC COMPANY LTD.)) to roughen the copper layer. Then, the adhesive film (without metal film layer) prepared in Example 1 was placed such that the curable resin composition layer contacted the copper circuit surface, and the film was laminated by a batch system vacuum-pressurization laminating machine MVLP-500 (manufactured by Meiko Co., Ltd., trade name). The lamination was performed for 30 seconds under reduced pressure at an atmospheric pressure of not more than 13 hPa. Thereafter, the laminate was pressed for 30 seconds at pressure 7.54 kgf/cm². Then, the releasing PET was detached, and the curable resin composition layer was heat-cured at 160° C. for 30 minutes. Thereafter, by an operation similar to that in Example 4, a via was formed by a UV-YAG laser. A desmear treatment was not performed and an electroless plating was performed. However, the plating did not attach in most part, and many blisters were produced by a subsequent heat treatment at 150° C. for 30 minutes. Therefore, the evaluation of peel strength was not performed.

Comparative Example 5

By an operation similar to that in Comparative Example 4, an adhesive film (without metal film layer) was laminated on a glass epoxy substrate and heat-cured. Thereafter, by an operation similar to that in Example 1, via formation, PET detachment and desmear treatment were performed. Here, a roughening treatment of the insulating layer surface was performed simultaneously with the desmear treatment. Thereafter, by an operation similar to that in Example 1, a multilayer printed wiring board was obtained. After copper electroless plating and copper electroplating, inconveniences such as blisters and the like did not occur and the peel strength was as high as about 0.7 kgf/cm, but Ra was as high as not less than 500 nm.

Comparative Example 6

An adhesive film (without metal film layer) having the same curable resin composition layer as in Example 1 was prepared. A glass epoxy substrate having a circuit formed from a 18 μm-thick copper layer was subjected to a treatment with CZ8100 (surface treating agent containing azole-copper complex and organic acid (manufactured by MEC COMPANY LTD.)) to roughen the copper layer. Then, the adhesive film was placed such that the curable resin composition layer contacted the copper circuit surface, and the films were laminated on both sides of the substrate by a batch system vacuum-pressurization laminating machine MVLP-500 (manufactured by Meiko Co., Ltd.). The lamination was performed for 30 seconds under reduced pressure at an atmospheric pressure of not more than 13 hPa. Thereafter, the laminate was heat-cured at 160° C. for 30 minutes to form an insulating layer. The PET film with a release agent was detached, and copper electroless plating was performed by an operation similar to that in Example 1. However, after taking out from the electroless plating bath, the conductive layer was easily peeled off in the process of washing with water, and a conductive layer having high adhesiveness was not obtained.

Comparative Example 7

Preparation of Adhesive Film Having Curable Resin Composition Layer

A liquid bisphenol A type epoxy resin (epoxy equivalent 180, "Epikote 828EL" manufactured by Japan Epoxy Resins Co., Ltd., 28 parts), a nitrogen-containing epoxy resin (epoxy equivalent 140, "TEPIC-PAS B26" manufactured by Nissan Chemical Industries, Ltd., nitrogen content about 12 wt %, 28 parts), and a phenoxy resin ("YX6954BH30" manufactured by Japan Epoxy Resins Co., Ltd., 25 parts) were dissolved by stirring with heating in MEK (15 parts) and cyclohexanone (15 parts). Thereto were added a triazine-containing phenol novolac resin (hydroxyl group equivalent 146, "LA1356" manufactured by DIC Corporation, nitrogen content about 19 wt %, 44 parts), spherical silica (average particle size 0.5 μm, "SOC2" manufactured by Admatechs Company Limited, 70 parts), and a 1:1 solution (30 parts, solid content 15 wt %) of a polyvinyl butyral resin ("KS-1" manufactured by SEKISUI CHEMICAL CO., LTD.) in ethanol and toluene, and the mixture was uniformly dispersed by a high-speed rotary mixer to give a resin varnish. The above-mentioned varnish was applied to a poly(ethylene terephthalate) film (manufactured by LINTEC Corporation) with a 38 μm-thick alkyd type release agent (AL-5, manufactured by LINTEC Corporation) with a die coater, and the solvent was removed using a hot air drying oven to give an adhesive film having a 40 μm-thick curable resin composition layer. The nitrogen content relative to the solid content then was about 5.1 wt %.

Lamination and Curing of Adhesive Film on Internal-Layer Circuit Substrate.

A glass epoxy substrate having a circuit formed from a 18 μm-thick copper layer was subjected to a treatment with CZ8100 (surface treating agent containing azole-copper complex and organic acid (manufactured by MEC COMPANY LTD.)) to roughen the copper layer. Then, the film was placed such that the curable resin composition layer contacted the copper circuit surface, and the films were laminated on both sides of the substrate by a batch system vacuum-pressurization laminating machine MVLP-500 (manufactured by Meiko Co., Ltd.). The lamination was performed for 30 seconds under reduced pressure at an atmospheric pressure of not more than 13 hPa. Thereafter, the laminate was heat-cured at 160° C. for 30 minutes to form an insulating layer. The PET film with a release agent was detached, and copper electroless plating was performed by an operation similar to that in Example 1. However, the copper electroless plating was not precipitated. The nitrogen atom concentration of the insulating layer surface was about 1.9 atomic % (about 2.0 wt %).

Reference Example 1

In the same manner as in Example 1, a hydroxypropylmethylcellulose phthalate layer (about 1 μm) was formed on T60 (manufactured by Toray Industries, Inc., poly(ethylene terephthalate) film), and then, a copper layer (about 1000 nm) was formed by vapor deposition to give a film with a metal film. The arithmetic mean roughness of the metal film was 13 nm.

TABLE 1

|  | Ex. 1 | Ex. 2 | Ex. 3 | Ex. 4 | Ex. 5 | Ex. 6 |
|---|---|---|---|---|---|---|
| Ra (nm) | 50 | 48 | 50 | 50 | 31 | 150 |
| peel strength (kgf/cm) | 0.82 | 0.56 | 0.82 | 0.85 | 0.85 | 0.90 |

TABLE 2

|  | Comp. Ex. 1 | Comp. Ex. 2 | Comp. Ex. 3 | Comp. Ex. 4 |
|---|---|---|---|---|
| Ra (nm) | 99 | 1052 | — | — |
| peel strength (kgf/cm) | 0.12 | 0.89 | | |

|  | Comp. Ex. 5 | Comp. Ex. 6 | Comp. Ex. 7 |
|---|---|---|---|
| Ra (nm) | 533 | — | — |
| peel strength (kgf/cm) | 0.67 | | |

In Examples, inconveniences such as blisters and the like did not occur after copper electroless plating and copper electroplating, and a plating conductive layer superior in peel strength was formed on the smooth insulating layer surface. Since a plating seed layer (electroless plating layer) can be formed on an extreme smooth insulating layer surface by electroless plating, an unnecessary plating seed layer can be easily removed by etching after circuit formation in a semi-additive process.

In contrast, from Comparative Examples 1 and 3, when a curable resin composition layer was formed on the smooth surface of a metal foil, a smooth surface was obtained as compared to the roughening-treated insulating layer surface, but a conductive layer was difficult to form by plating or peel strength was markedly low. In addition, when a curable resin composition layer was formed on the roughened surface of the metal foil in Comparative Example 2, the peel strength of the conductive layer formed by plating was good, but the surface smoothness was found to be markedly inferior. Moreover, when an adhesive film without a metal film was used, the peel strength of the conductive layer was good in Comparative Example 5 in which the insulating layer surface was roughening-treated with an oxidizing agent. However, the plane smoothness was again markedly inferior. In Comparative Examples 4 and 6 free of a roughening treatment, a conductive layer was difficult to form.

XPS Measurement of Insulating Layer Surface after Etching Metal Film Layer.

The insulating layer surface after etching the metal film layer in Example 1 was subjected to measurement by X-ray photoelectron spectroscopy analysis (XPS). For comparison, a curable resin composition layer having a poly(ethylene terephthalate) film with an alkyd type release agent (AL-5, manufactured by LINTEC Corporation) was cured in Comparative Example 6 (that is, the curable resin composition layer with the poly(ethylene terephthalate) film was cured), and the insulating layer surface was subjected to XPS measurement after detaching the PET film with the release agent. Also for comparison, using the curable resin composition with an enhanced nitrogen component content in Comparative Example 7, a curable resin composition layer having a poly(ethylene terephthalate) film with an alkyd type release agent (AL-5, manufactured by LINTEC Corporation) was cured, and the insulating layer surface was subjected to XPS measurement after detaching the PET film with the release agent. The measurement apparatus and measurement conditions were as follows.

Measurement apparatus.
apparatus type: QUANTERA SXM (full automatic scanning X-ray photoelectron spectrometer)
ultimate pressure: $7.0 \times 10^{-10}$ Torr
X-ray source: monochromatized Al Kα (1486.6 eV)
spectroscope: concentric hemispherical analyzer
detector: multi-channel type (32 Multi-Channel Detector)
flood gun setting electron: 1.0 V (20 μA), ion: 10.0 V (7 mA)
Measurement condition.
Survey spectrum.
X-ray beam diameter: 100 μm Φ (HP mode, 100.6 W, 20 kV)
measurement region: 1400 μm×100 μm
acceptance angle of signals: 45.0°
pass energy: 280.0 eV The results are shown in Table 3.

TABLE 3

| XPS measurement | Ex. 1 | Com. Ex. 6 | Com. Ex. 7 |
|---|---|---|---|
| C/atomic % | 72.6 | 78.4 | 76.8 |
| O/atomic % | 17.9 | 20.6 | 21.2 |
| N/atomic % | 7.6 | 0.9 | 1.9 |
| P/atomic % | 0.4 | 0.2 | 0.01 |
| Si/atomic % | 0.8 | 0.01 | 0.01 |

The nitrogen atom concentration of the cured product (insulating layer) surface after curing the composition having a poly(ethylene terephthalate) film with an alkyd type release agent (AL-5, manufactured by LINTEC Corporation) was about 0.9 atomic % (about 1.0 wt %). In contrast, the nitrogen atom concentration of the cured product after curing the composition having a metal film layer in Example 1 was about 7.6 atomic % (about 8.0 wt %), where the nitrogen atom concentration of the insulating layer surface markedly increased despite the use of the same curable resin composition. In Comparative Example 7, moreover, the nitrogen component content of the whole curable resin composition was increased. However, the peel strength was not improved.

Where a numerical limit or range is stated herein, the endpoints are included. Also, all values and subranges within a numerical limit or range are specifically included as if explicitly written out.

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:
1. A method of producing a multilayer printed wiring board, comprising:
(A) laminating (i) a film with a first metal film, wherein said film with a first metal film comprises a first metal film layer formed on a support layer, on (ii) an internal-layer circuit substrate via a curable resin composition layer;

(B) curing said curable resin composition layer to form an insulating layer;
(C) removing said support layer;
(D) removing all of said first metal film layer; and
(E) forming a second metal film layer on said insulating layer surface by electroless plating.

2. A method according to claim 1, wherein said first metal film layer is not formed by applying a preformed metal foil to said support layer.

3. A method according to claim 1, wherein said first metal film layer is formed by one or more kinds of methods selected from the group consisting of a vapor deposition method, a sputtering method and an ion plating method.

4. A method according to claim 1, wherein said first metal film layer is formed from copper.

5. A method according to claim 1, wherein said second metal film layer is formed from copper.

6. A method according to claim 1, wherein the insulating layer surface, after removing said first metal film layer, has an arithmetic mean roughness (Ra) of not more than 200 nm.

7. A method according to claim 1, wherein the insulating layer surface, after removing said first metal film layer, has an arithmetic mean roughness (Ra) of not more than 80 nm.

8. A method according to claim 1, further comprising:
(F) forming a blind via after (B) curing said curable resin composition layer to form an insulating layer or (C) removing said support layer.

9. A method according to claim 8, further comprising:
(G) conducting desmearing after (F) forming a blind via.

10. A method according to claim 1, further comprising:
(H) forming a conductive layer by electroplating after (E) forming a second metal film layer on an insulating layer surface by electroless plating.

11. A method according to claim 1, wherein a release layer is present between said support layer and said first metal film layer.

12. A method according to claim 11, wherein said release layer is formed from one or more kinds of water-soluble polymers selected from the group consisting of a water-soluble cellulose resin, a water-soluble polyester resin and a water-soluble acrylic resin.

13. A method according to claim 12, wherein said water-soluble polyester resin is a water-soluble polyester having a sulfo group or a salt thereof and/or a carboxyl group or a salt thereof, and said water-soluble acrylic resin is a water-soluble acrylic resin having a carboxyl group or a salt thereof.

14. A method according to claim 11, further comprising:
(I) removing said release layer after (C) removing said support layer.

15. A method according to claim 11, wherein said release layer has a layer thickness of 0.01 μm to 20 μm.

16. A method according to claim 1, wherein said first metal film layer has a layer thickness of 25 nm to 5000 nm.

17. A method according to claim 1, wherein said support layer has a layer thickness of 10 μm to 70 μm.

18. A method according to claim 1, wherein said support layer has an arithmetic mean roughness (Ra) of not more than 50 nm.

19. A method according to claim 1 wherein said support layer is a plastic film.

20. A method according to claim 1, wherein said support layer is a poly(ethylene terephthalate) film.

21. A method according to claim 1, wherein said curable resin composition comprises a component having a hetero atom in a molecule.

22. A method according to claim 1, wherein said curable resin composition comprises a component having a nitrogen atom in a molecule.

23. A method according to claim 1, wherein said curable resin composition comprises an epoxy resin and a curing agent.

24. A method according to claim 23, wherein said curing agent comprises a nitrogen atom in a molecule.

25. A method according to claim 23, wherein said curing agent is a triazine skeleton-containing phenol novolac resin and/or a triazine skeleton-containing cresol novolac resin.

26. A method according to claim 21, wherein said curable resin composition further comprises a thermoplastic resin.

27. A method according to claim 21, wherein said curable resin composition further comprises an inorganic filler.

28. A method according to claim 1, wherein said curable resin composition layer is a prepreg comprised of a sheet-like reinforcing substrate made of fiber and impregnated with the curable resin composition.

29. A method of producing a multilayer printed wiring board, comprising:
(A) laminating (i) an adhesive film with a first metal film, wherein said adhesive film with a first metal film comprises a curable resin composition layer formed on a first metal film layer, wherein said first metal film layer is formed on a support layer on (ii) an internal-layer circuit substrate;
(B) curing said curable resin composition layer to form an insulating layer;
(C) removing said support layer;
(D) removing all of said first metal film layer; and
(E) forming a second metal film layer on said insulating layer surface by electroless plating.

30. A method according to claim 29, wherein said first metal film layer is not formed by applying a preformed metal foil to said support layer.

31. A method according to claim 29, wherein said first metal film layer is formed by one or more kinds of methods selected from the group consisting of a vapor deposition method, a sputtering method and an ion plating method.

32. A method according to claim 29, wherein said first metal film layer is formed from copper.

33. A method according to claim 29, wherein said second metal film layer is formed from copper.

34. A method according to claim 29, wherein the insulating layer surface, after removing said first metal film layer, has an arithmetic mean roughness (Ra) of not more than 200 nm.

35. A method according to claim 29, wherein the insulating layer surface, after removing said first metal film layer, has an arithmetic mean roughness (Ra) of not more than 80 nm.

36. A method according to claim 29, further comprising:
(F) forming a blind via after (B) curing said curable resin composition layer to form an insulating layer or (C) removing said support layer.

37. A method according to claim 36, further comprising:
(G) conducting desmearing after (F) forming a blind via.

38. A method according to claim 29, further comprising:
(H) forming a conductive layer by electroplating after (E) forming a second metal film layer on an insulating layer surface by electroless plating.

39. A method according to claim 29, wherein a release layer is present between said support layer and said first metal film layer.

40. A method according to claim 39, wherein said release layer is formed from one or more kinds of water-soluble polymers selected from the group consisting of a water-soluble cellulose resin, a water-soluble polyester resin and a water-soluble acrylic resin.

41. A method according to claim 40, wherein said water-soluble polyester resin is a water-soluble polyester having a sulfo group or a salt thereof and/or a carboxyl group or a salt thereof, and said water-soluble acrylic resin is a water-soluble acrylic resin having a carboxyl group or a salt thereof.

42. A method according to claim 39, further comprising:
(I) removing said release layer after (C) removing said support layer.

43. A method according to claim 39, wherein said release layer has a layer thickness of 0.01 μm to 20 μm.

44. A method according to claim 39, wherein said first metal film layer has a layer thickness of 25 nm to 5000 nm.

45. A method according to claim 39, wherein said support layer has a layer thickness of 10 μm to 70 μm.

46. A method according to claim 39, wherein said support layer has an arithmetic mean roughness (Ra) of not more than 50 nm.

47. A method according to claim 39 wherein said support layer is a plastic film.

48. A method according to claim 39, wherein said support layer is a poly(ethylene terephthalate) film.

49. A method according to claim 39, wherein said curable resin composition comprises a component having a hetero atom in a molecule.

50. A method according to claim 39, wherein said curable resin composition comprises a component having a nitrogen atom in a molecule.

51. A method according to claim 39, wherein said curable resin composition comprises an epoxy resin and a curing agent.

52. A method according to claim 51, wherein said curing agent comprises a nitrogen atom in a molecule.

53. A method according to claim 51, wherein said curing agent is a triazine skeleton-containing phenol novolac resin and/or a triazine skeleton-containing cresol novolac resin.

54. A method according to claim 49, wherein said curable resin composition further comprises a thermoplastic resin.

55. A method according to claim 49, wherein said curable resin composition further comprises an inorganic filler.

56. A method according to claim 29, wherein said curable resin composition layer is a prepreg comprised of a sheet-like reinforcing substrate made of fiber and impregnated with the curable resin composition.

* * * * *